US012660295B2

(12) United States Patent
Ho et al.

(10) Patent No.: US 12,660,295 B2
(45) Date of Patent: Jun. 16, 2026

(54) SEMICONDUCTOR DEVICE INCLUDING THIN FILM TRANSISTOR AND METHOD FOR FORMING THE SAME

(71) Applicant: TAIWAN SEMICONDUCTOR MANUFACTURING COMPANY LTD., Hsinchu (TW)

(72) Inventors: Yen-Chung Ho, Hsinchu (TW); Yong-Jie Wu, Tainan City (TW); Hui-Hsien Wei, Taoyuan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 584 days.

(21) Appl. No.: 18/154,030

(22) Filed: Jan. 12, 2023

(65) Prior Publication Data

US 2024/0096706 A1     Mar. 21, 2024

Related U.S. Application Data

(60) Provisional application No. 63/375,697, filed on Sep. 15, 2022.

(51) Int. Cl.
| | |
|---|---|
| *H10D 84/03* | (2025.01) |
| *H10D 30/01* | (2025.01) |
| *H10D 30/67* | (2025.01) |
| *H10D 84/01* | (2026.01) |

(52) U.S. Cl.
CPC ......... *H10D 84/038* (2025.01); *H10D 30/031* (2025.01); *H10D 30/6755* (2025.01); *H10D 84/013* (2025.01); *H10D 84/0149* (2025.01)

(58) Field of Classification Search
CPC .............. H10D 84/038; H10D 30/031; H10D 30/6755; H10D 84/013; H10D 84/0149
See application file for complete search history.

(56) References Cited

U.S. PATENT DOCUMENTS

2017/0229486 A1 *  8/2017  Matsuda ............ H10D 30/6757
* cited by examiner

*Primary Examiner* — Jay C Kim
*Assistant Examiner* — Woo K Lee
(74) *Attorney, Agent, or Firm* — WPAT LAW; Anthony King

(57) ABSTRACT

The present disclosure provides a method of forming a semiconductor device. The method includes: forming an interconnect structure over a substrate; forming a first gate structure and a second gate structure in a first layer of the interconnect structure; forming a first metal oxide layer and a second metal oxide layer in a second layer of the interconnect structure over the first gate structure and the second gate structure, respectively; forming an implant mask over the first metal oxide layer and the second metal oxide layer, the implant mask having different thicknesses corresponding to the first metal oxide layer and the second oxide layer; and performing an implantation operation on the first metal oxide layer and the second metal oxide layer.

20 Claims, 25 Drawing Sheets

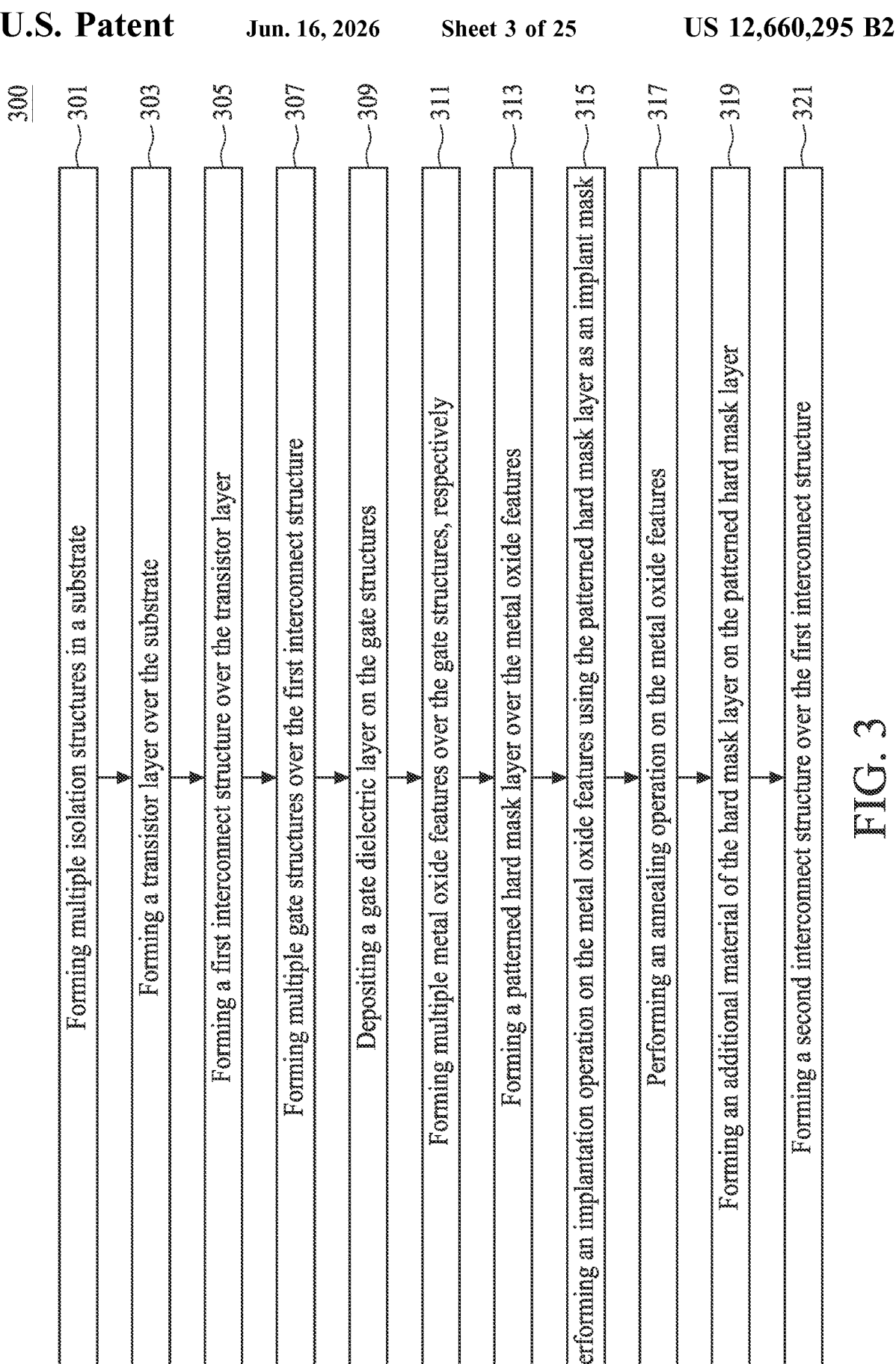

300

301 Forming multiple isolation structures in a substrate

303 Forming a transistor layer over the substrate

305 Forming a first interconnect structure over the transistor layer

307 Forming multiple gate structures over the first interconnect structure

309 Depositing a gate dielectric layer on the gate structures

311 Forming multiple metal oxide features over the gate structures, respectively 313 Forming a patterned hard mask layer over the metal oxide features 315 Performing an implantation operation on the metal oxide features using the patterned hard mask layer as an implant mask 317 Performing an annealing operation on the metal oxide features 319 Forming an additional material of the hard mask layer on the patterned hard mask layer 321 Forming a second interconnect structure over the first interconnect structure

SEMICONDUCTOR DEVICE INCLUDING THIN FILM TRANSISTOR AND METHOD FOR FORMING THE SAME

PRIORITY CLAIM AND CROSS-REFERENCE

This application claims the benefit of prior-filed provisional application No. 63/375,697, filed on 15 Sep. 2022.

BACKGROUND

A thin-film transistor (TFT) is a special type of field-effect transistor (FET) where the transistor is thin relative to the plane of a semiconductor device. When the semiconductor device, such as a metal-oxide-semiconductor field-effect transistor (MOSFET), is scaled down through various technology nodes, processes of forming the MOSFET become more complicated.

There are some challenges when TFTs are required to be integrated with one or more MOSFETs, as the gate length and spacing between devices decrease. For example, it is difficult to tune the threshold voltage of multiple TFTs embedded in an interconnect structure formed over the MOSFETs to improve device performance with the decreased feature sizes. Therefore, there is a need to improve the semiconductor fabrication method.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

FIG. 3 is a flow diagram showing a method of fabricating a semiconductor device shown in FIG. 1, in accordance with some embodiments of the present disclosure.

DETAILED DESCRIPTION

Figure 1:
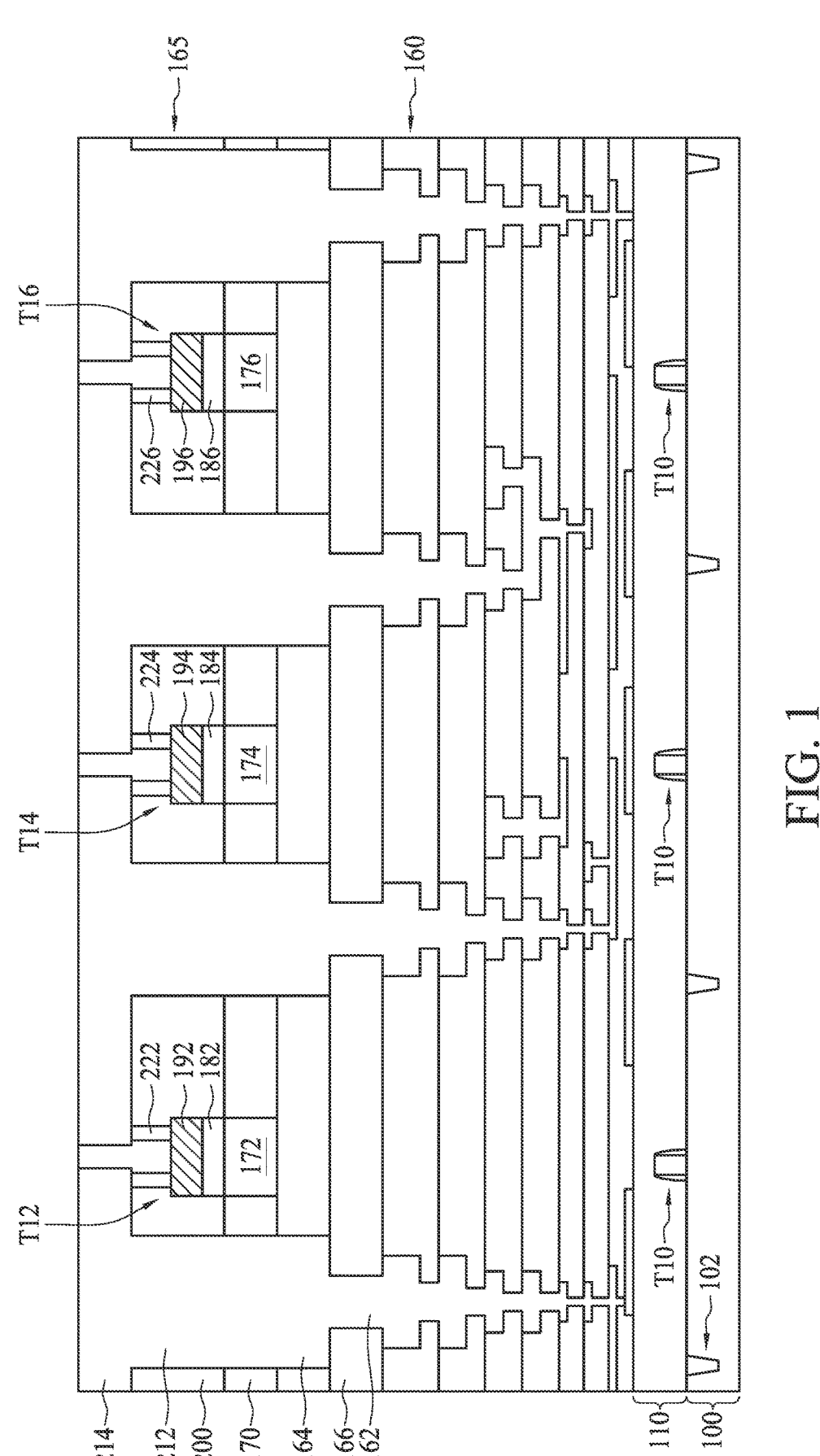
FIG. 1 is a schematic cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional view of a semiconductor device 10. The semiconductor device 10 includes multiple isolation structures 102 disposed in a substrate 100. Appropriate wells such as lightly doped source/drain (LDD) regions (not shown) are disposed in the substrate 100. A transistor layer 110 is disposed over the substrate 100. Multiple transistors T10 are disposed in the transistor layer 110. The transistors T10 are separated by the isolation structures 102. A first interconnect structure 160 is disposed over the transistor layer 110. The first interconnect structure 160 includes multiple conductive features such as conductive vias 162 and conductive lines 164 that are mutually connected and embedded in an inter-layer dielectric (ILD)

layer 166. The first interconnect structure 160 is electrically coupled to the transistors T10.

Multiple gate structures 172, 174 and 176 are disposed over the first interconnect structure 160. The gate structures 172, 174 and 176 are surrounded by an ILD layer 170 disposed on the first interconnect structure 160. Gate dielectric features 182, 184 and 186 are respectively disposed on the gate structures 172, 174 and 176. Metal oxide features 192, 194 and 196 are respectively disposed on the gate dielectric features 182, 184 and 186. The metal oxide features 192, 194 and 196 and the gate dielectric features 182, 184 and 186 are surrounded by a hard mask layer 200 which can be referred to as an ILD layer 200.

A second interconnect structure 165 is disposed over the first interconnect structure 160. The second interconnect structure 165 includes multiple higher-level conductive features such as conductive vias 212 and conductive lines 214 that are mutually connected and embedded in the hard mask layer 200.

Source/drain (S/D) structures 222, 224 and 226 are respectively disposed on the metal oxide features 192, 194 and 196. The S/D structures 222, 224 and 226 are electrically coupled to the second interconnect structure 165. The second interconnect structure 165 and the first interconnect structure 160 may be collectively referred to as an interconnect structure. The first gate structure 172, the first gate dielectric feature 182, the first metal oxide feature 192 and the first S/D structure 222 form a first transistor T12. The second gate structure 174, the second gate dielectric feature 184, the second metal oxide feature 194 and the second S/D structure 224 form a second transistor T14. The third gate structure 176, the third gate dielectric feature 186, the third metal oxide feature 196 and the third S/D structure 226 form a third transistor T16. The transistors T12, T14 and T16 are thin film transistors (TFTs) disposed adjacent to each other. The first transistor T12 has a first threshold voltage ($V_{th}$), the second transistor T14 has a second threshold voltage, and the third transistor T16 has a third threshold voltage. The first threshold voltage is greater than the second threshold voltage, and the second threshold voltage is greater than the third threshold voltage.

Figure 2:
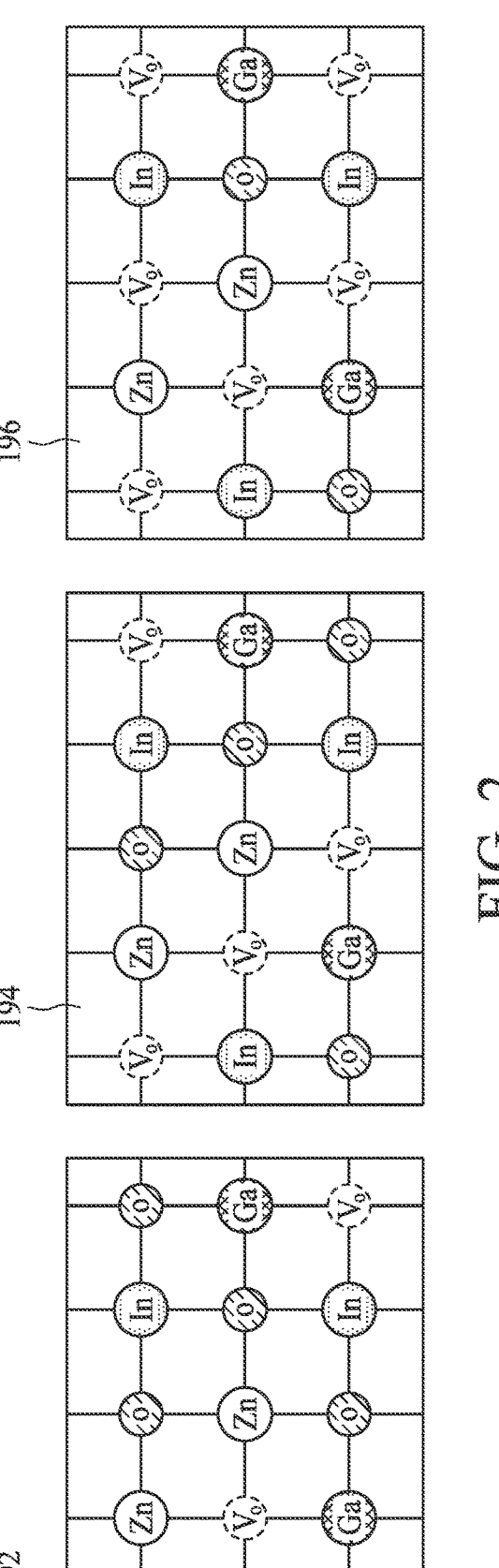
FIG. 2 shows schematic lattice structures of a metal oxide feature formed in the semiconductor device shown in FIG. 1, in accordance with some embodiments of the present disclosure.

FIG. 2 shows schematic lattice structures of the metal oxide feature 192, 194 and 196. The lattice structure of the first metal oxide feature 192 has less oxygen vacancies ($V_o$) than the lattice structure of the second metal oxide feature 194. The lattice structure of the second metal oxide feature 194 has less oxygen vacancies than the lattice structure of the third metal oxide feature 196. More oxygen vacancies mean there are more electron holes (carriers) in the lattice structure, and a metal oxide feature having more electron holes is more conductive. Therefore, the third metal oxide feature 196 is more conductive than the second metal oxide feature 194 than the first metal oxide feature 192, which explains third threshold voltage is less than the second threshold voltage and the second threshold voltage is less the first threshold voltage.

FIG. 3 is a flow diagram showing a method 300 of fabricating the semiconductor device 10 in FIG. 1. FIGS. 4 to 25 are schematic cross-sectional views illustrating sequential operations of the method 300 shown in FIG. 3. The method 300 includes a number of operations (301, 303, 305, 307, 309, 311, 313, 315, 317, 319 and 321) and the description and illustration are not deemed as a limitation to the sequence of the operations. Multiple isolation structures are formed in a substrate in operation 301. A transistor layer is formed over the substrate in operation 303. A first interconnect structure is formed over the transistor layer in operation 305. Multiple gate structures are formed over the first interconnect structure in operation 307. A gate dielectric layer is deposited on the gate structures in operation 309. Multiple metal oxide features are respectively formed over the first gate structures in operation 311. A patterned hard mask layer is formed over the metal oxide features in operation 313. An implantation operation is performed on the metal oxide features using the patterned hard mask layer as an implant mask in operation 315. An annealing operation is performed on the metal oxide features in operation 317. An additional material of the hard mask layer is formed on the patterned hard mask layer in operation 319. A second interconnect structure is formed over the first interconnect structure in operation 321.

Figure 4:
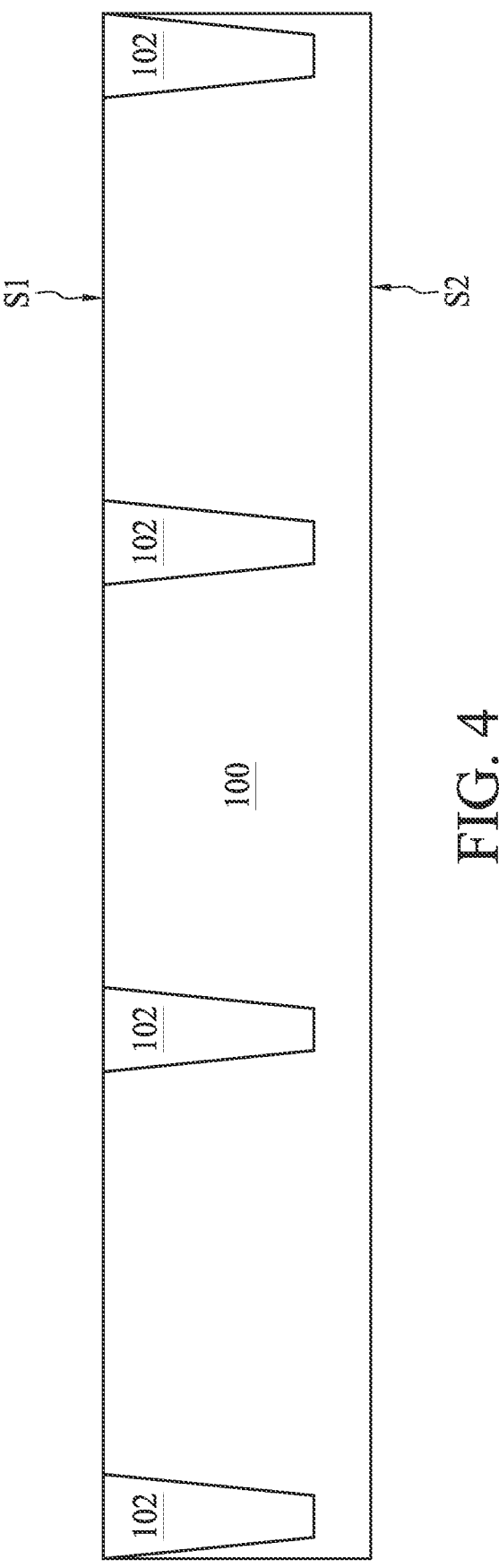
FIGS. 4 to 21 are schematic cross-sectional views illustrating sequential operations of the method shown in FIG. 3, in accordance with some embodiments of the present disclosure.

In operation 301 of FIG. 3, multiple isolation structures 102 are formed in a substrate 100, as shown in FIG. 4. The substrate 100 may be a semiconductor substrate such as a bulk silicon wafer. In some embodiments, the substrate 100 is a semiconductor-on-insulator (SOI) substrate, a multi-layered or gradient substrate, or the like. The substrate 100 may include a semiconductor material such as Si, Ge, a compound or alloy semiconductor including SiC, SiGe, GaAs, GaP, GaAsP, AlInAs, AlGaAs, GaInAs, InAs, GaInP, InP, InSb, GaInAsP, or a combination thereof. The substrate 100 may be doped or undoped. The substrate has a top surface S1 and a back surface S2 opposite to the top surface S1. In some embodiments, the top surface S1 of the substrate 100 is an active side. In some embodiments, the back surface S2 of the substrate 100 is an active side.

The isolation structures 102 may be shallow trench isolation (STI) regions. Although not specifically illustrated, the isolation structures 102 may be formed using a series of lithographic, etching, deposition and/or planarization operations. For example, multiple trenches may be formed in the substrate 100 using an etching operation such as reactive ion etching (RIE), dry etching, or a combination thereof. Subsequently, an insulating material is deposited to fill the trenches. The insulating material may be silicon oxide, silicon nitride, or a combination thereof. The insulating material may be deposited using chemical vapor deposition (CVD), atmospheric pressure CVD (APCVD), high density plasma CVD (HDP-CVD), or other suitable methods. A planarization operation, such as a chemical mechanical polishing (CMP) operation, may be used to remove any excess insulating material over the top surface S1 of the substrate 100. As a result, the formation of the isolation structures 102 is complete. Top surfaces of the isolation structures 102 are coplanar with the top surface S1.

Appropriate wells may be formed in the substrate 100. In some embodiments, the isolation structures 102 are used to define one or more transistor regions in or over the substrate 100. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100 using an implant mask.

Figure 5:
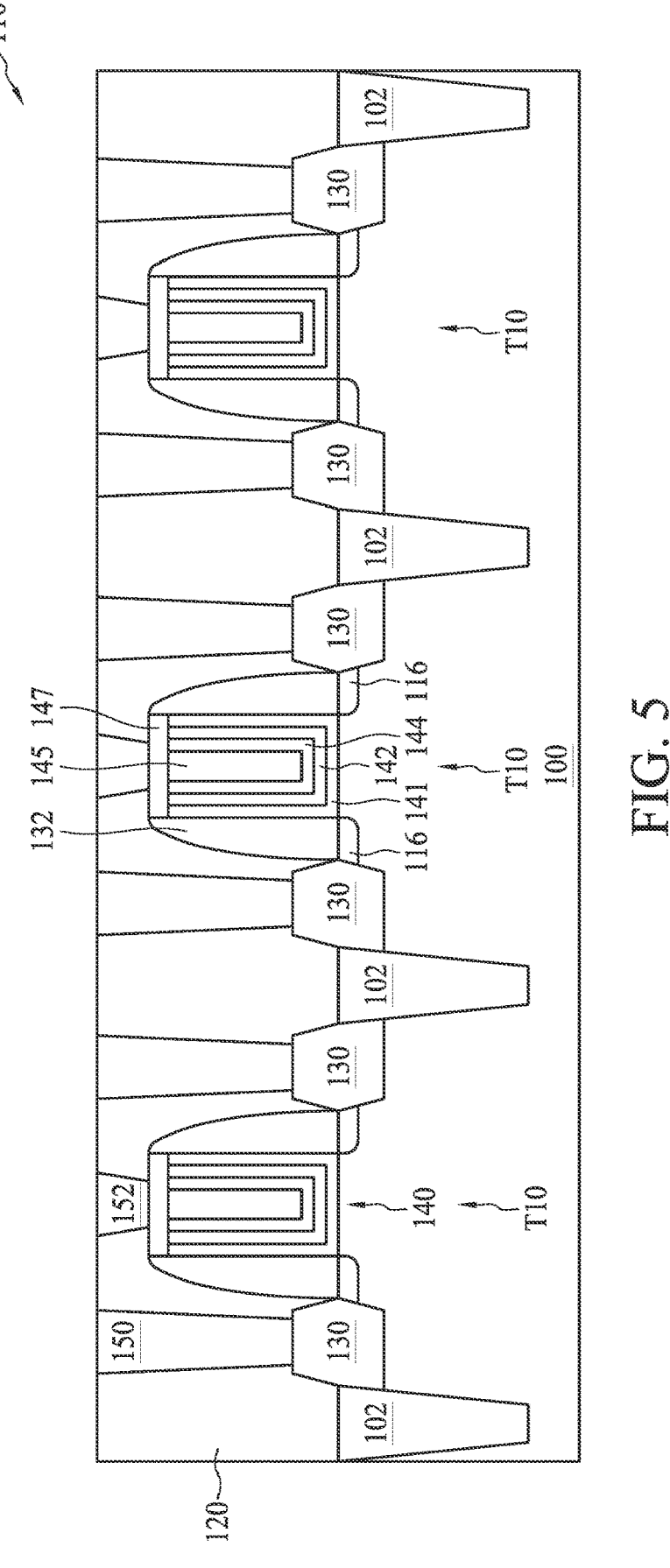

In operation 303 of FIG. 3, a transistor layer 110 is formed over the substrate 100, as shown in FIG. 5. The transistor layer 110 is formed in a front-end-of-line (FEOL) stage during the formation of the semiconductor device 10. Multiple transistors T10 are formed in the transistor layer 110.

The transistors T10 may be complementary metal-oxide-semiconductor (CMOS) transistors. The transistors T10 may include planar transistors, fin field-effect transistors (Fin-FETs), gate-all-around (GAA) transistors, nanosheet transistors, and the like. The transistors T10 shown in FIG. 5 and following figures are just exemplary examples. There is no limitation on the type of the transistors T10.

To form the transistors T10, an ILD layer 120 is formed on the substrate 100. The ILD layer 120 may be formed by depositing a dielectric material onto the isolation structures 102 using spin-on coating, CVD, ALD, and/or other suitable methods. The dielectric material may include silicon oxide, silicon nitride, undoped silicate glass (USG), phospho-silicate glass (PSG), boro-silicate glass (BSG), boron-doped phospho-silicate glass (BPSG), tetraethyl orthosilicate (TEOS), or other suitable materials. In some embodiments, the dielectric material of the ILD layer 120 includes an extreme low-k (ELK) dielectric material, which has a dielectric constant between 2.0 and 3.0.

The transistors T10 may be formed in the ILD layer 120. The transistors T10 are separated by the isolation structures 102. Although not specifically illustrated, the transistors T10 may be formed using a series of lithographic, etching, epitaxial, implantation, deposition, and/or planarization operations. Each transistor T10 includes a pair of epitaxial features 130 and a functional gate structure 140 between the pair of epitaxial features 130. A channel region (not shown) may be located in the substrate 100 and between the pair of epitaxial features 130. The epitaxial features 130 may be formed using metal-organic chemical vapor deposition (MOCVD), selective epitaxial growth (SEG), molecular-beam epitaxy (MBE), vapor-phase epitaxy (VPE), liquid-phase epitaxy (LPE), and/or other suitable methods. The formation of the epitaxial features 130 may include doping with N-type or P-type dopants, which cause the epitaxial features 130 to be conductive. The epitaxial features 130 may have a profile of triangular, trapezoidal, pentagonal, or hexagonal, depending on their formation method. The functional gate structure 140 may be formed using a "replacement polysilicon gate (RPG)" method. For example, a dummy gate structure (not shown) may be first formed on the substrate 100. The dummy gate structure may be surrounded by a gate spacer 132. The gate spacer 132 may be made of silicon nitride, silicon carbon nitride, a combination thereof, or the like. Prior to the formation of the gate spacer 132, an LDD region 116 may be formed in the substrate 100. The LDD region 116 may be formed by an ion-implantation operation. The LDD region 116 may include P-type dopants or N-type dopants depending on a P-type device or an N-type device is to be formed. Subsequently, the dummy gate structure is removed and replaced by the functional gate structure 140 shown in FIG. 5. The functional gate structure 140 may include a gate dielectric layer 141, a barrier layer 142, a work function layer 144 and a conductive layer 145.

The gate dielectric layer 141 may be formed using ALD, CVD or other suitable methods. The gate dielectric layer 141 may include a high-dielectric constant (high-k) dielectric material. For example, the gate dielectric layer 141 may have a dielectric constant greater than about 7.0 and may include a metal oxide or a silicate of Hf, Al, Zr, La, Mg, Ba, Ti, Pb, or a combination thereof. The gate dielectric layer 141 may include $HfO_2$, HfSiO, HfSiON, HfTaO, HfTiO, HfZrO, other suitable high-k dielectric materials. Prior to the formation of the gate dielectric layer 141, an interfacial dielectric layer can be formed on the substrate 100. The interfacial dielectric layer may be, for example, an oxide formed by thermal oxidation, chemical oxidation, ALD or another suitable method. The gate dielectric layer 141 may be surrounded by the LDD region 116. The gate dielectric layer 141 may cover inner sidewalls of the gate spacer 132 and a portion of the substrate 100.

The barrier layer 142 may be conformally formed on the gate dielectric layer 141 using ALD, CVD or other suitable methods. The barrier layer 142 may include a single layer or multiple sub-layers. The barrier layer 142 may include titanium nitride (TiN), tantalum nitride (TaN), the like, or a combination thereof. The barrier layer 142 may be used to prevent a subsequently-deposited metal-containing material from diffusing into the gate dielectric layer 141.

The work function layer 144 may be conformally formed on the barrier layer 142 using ALD, CVD or other suitable methods. The work function layer 144 may include a single layer or multiple sub-layers. For forming the work function layer 144, a gate material having a work function that can place its Fermi level close to the middle of the band gap of silicon is required. In order to tailor a threshold voltage ($V_{th}$) of the functional gate structure 140 that is to be formed, the gate material for forming the functional gate structure 140 should have a tunable work function. The work function layer 144 may be a suitable material used to tune a work function of the functional gate structure 140 to a desired level. The work function layer 144 may include TiN, TaN, tungsten nitride (WN), the like, or a combination thereof. In some embodiments, the gate dielectric layer 141, the barrier layer 142 and the work function layer 144 have a U-shaped profile, as shown in FIG. 5. In some other embodiments, the gate dielectric layer 141, the barrier layer 142 and the work function layer 144 have a flat profile.

The conductive layer 145 may be conformally formed on the work function layer 144 using physical vapor deposition (PVD), sputtering, electroplating, ALD or other suitable methods. The conductive layer 145 may include one or more conductive materials, such as W, Cu, Co, Al, Ni, Ta, Ti, Mo, Pd, Pt, Ru, Ir, Ag, Au, TiN, TaN, the like, or a combination thereof. A planarization operation, such as CMP, may be used to remove portions of the conductive layer 145, the work function layer 144, the barrier layer 142 and the gate dielectric layer 141 such that top surfaces of the conductive layer 145, the work function layer 144, the barrier layer 142 and the gate dielectric layer 141 may be substantially coplanar.

A cap layer 147 may be optionally formed on the conductive layer 145, the work function layer 144, the barrier layer 142 and the gate dielectric layer 141. The cap layer 147 may be formed using CVD, PECVD or other suitable methods. The cap layer 147 may be made of a dielectric material such as silicon nitride, silicon carbon nitride or the like.

The functional gate structure 140 may be surrounded by the gate spacer 132. The conductive layer 145 may function a gate electrode of the functional gate structure 140. In each transistor T10, the functional gate structure 140 may serve as a gate terminal, and the pair of epitaxial features 130 may serve as S/D terminals corresponding to the gate terminal. A silicide layer (not shown), such as cobalt-silicide (CoSi), nickel silicide (NiSi) or tungsten silicide (WSi), may be formed on a top surface of each epitaxial feature 130. The silicide layer may be used to increase compatibility between a material of the epitaxial feature 130 and a material of a conductive contact subsequently formed on the epitaxial feature 130. In addition, the silicide layer can reduce parasitic resistance or sheet resistance at a silicon/metal contact junction.

Conductive contacts 150 and 152 may be respectively formed over the epitaxial features 130 and the functional gate structures 140. Although not illustrated, the conductive contacts 150 and 152 may be formed using a series of lithographic, etching, deposition and planarization operations. For example, multiple contact holes may be formed in the ILD layer 120 to respectively expose the epitaxial features 130 and the functional gate structures 140. Subsequently, one or more conductive materials, such as W, Cu, Co, Al, Ni, Ta, Ti, Mo, Pd, Pt, Ru, Ir, Ag, Au, the like, or a combination thereof, may be deposited into the contact holes using sputtering, electroplating, PVD or other suitable methods to form the conductive contacts 150 and 152. A planarization operation, such as a CMP operation, may be used to remove any excess conductive material over the top surface of the ILD layer 120. The conductive contacts 150 and 152 may be simultaneously formed or separately formed. The order for forming the conductive contacts 150 and 152 is not limited. The conductive contact 150 may be electrically coupled to the epitaxial feature 130, and the conductive contact 152 may be electrically coupled to the functional gate structure 140. A diffusion barrier layer (not shown) may be disposed between each of the conductive contacts 150 and the ILD layer 120 and between each of the conductive contacts 152 and the ILD layer 120. The diffusion barrier layer may be formed of TiN, TaN, Ta, Ti, TiSN, TaSN, W, WN, or combinations thereof, using ALD, PVD or other suitable methods. The diffusion barrier layer may be used to prevent the conductive material of the conductive contacts 150 and 152 from diffusing into the ILD layer 120.

Figure 6:
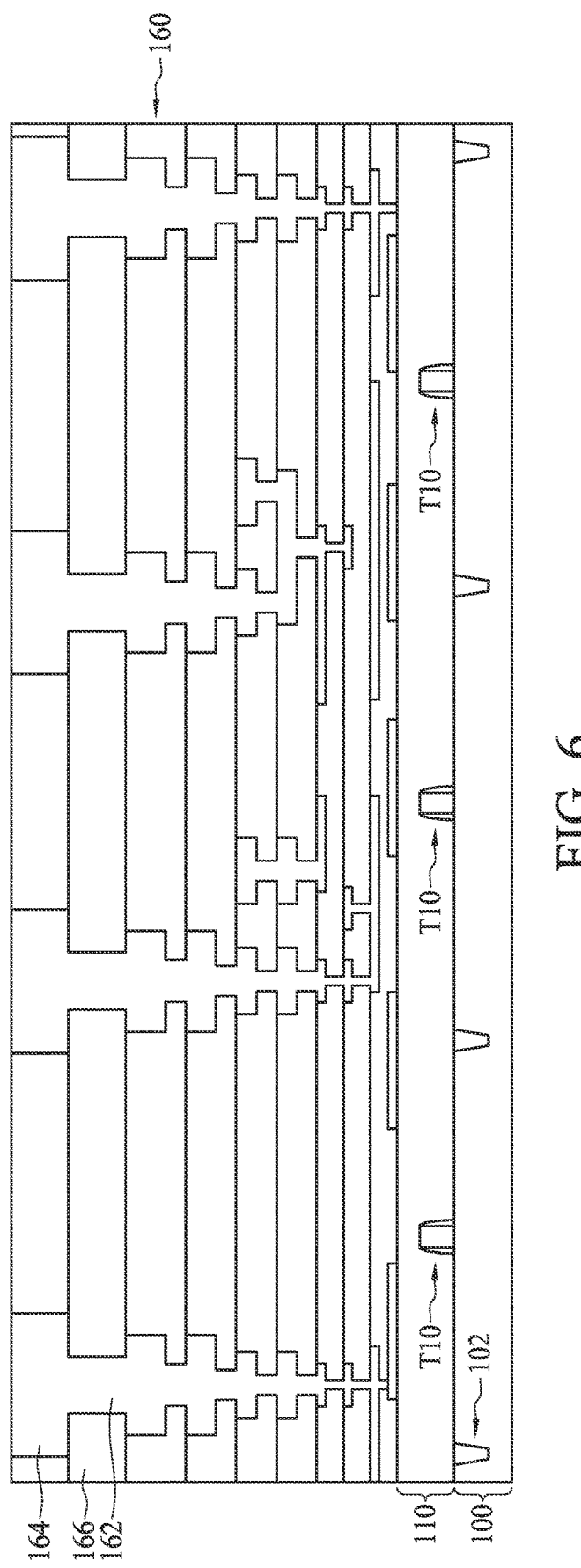

In operation 305 of FIG. 3, a first interconnect structure 160 is formed over the transistor layer 110, as shown in FIG. 6. The first interconnect structure 160 includes multiple conductive features such as conductive vias 162 and conductive lines 164 that are mutually connected and embedded in an ILD layer 166 or an inter-metal dielectric (IMD) layer. The conductive vias 162, the conductive lines 164 and the ILD layer 166 are formed in a BEOL stage during the formation of the semiconductor device 10. Although not illustrated, the first interconnect structure 160 may be formed using a series of lithographic, etching, deposition and planarization operations. The conductive vias 162 and the conductive lines 164 may be formed using a single-damascene method or a dual-damascene method. The conductive vias 162 and the conductive lines 164 may be electrically coupled to the transistors T10 through the conductive contacts 150 and 152. The ILD layer 166 may be made of the same or similar materials as those of the ILD layer 120. The ILD layer 166 may be formed spin-on coating, CVD, ALD, and/or other suitable methods.

Figure 7:
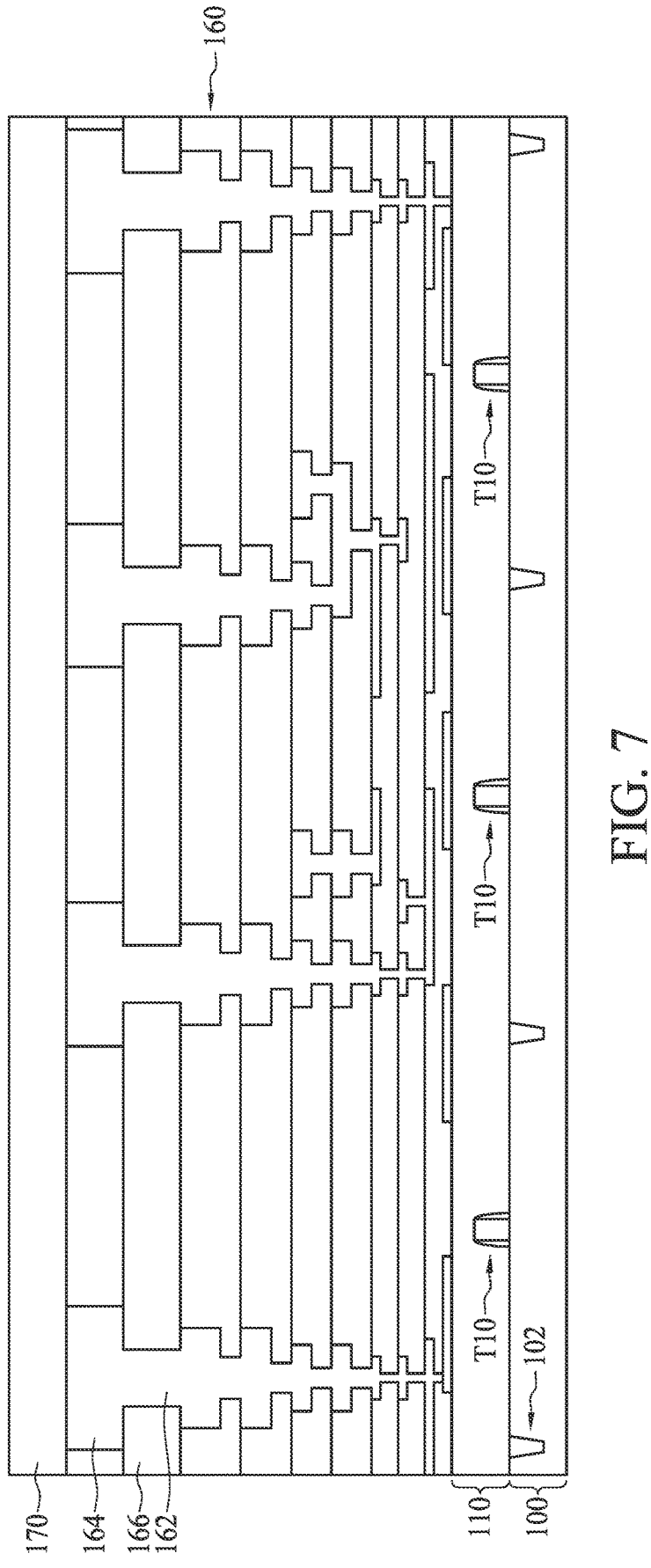
Figure 8:
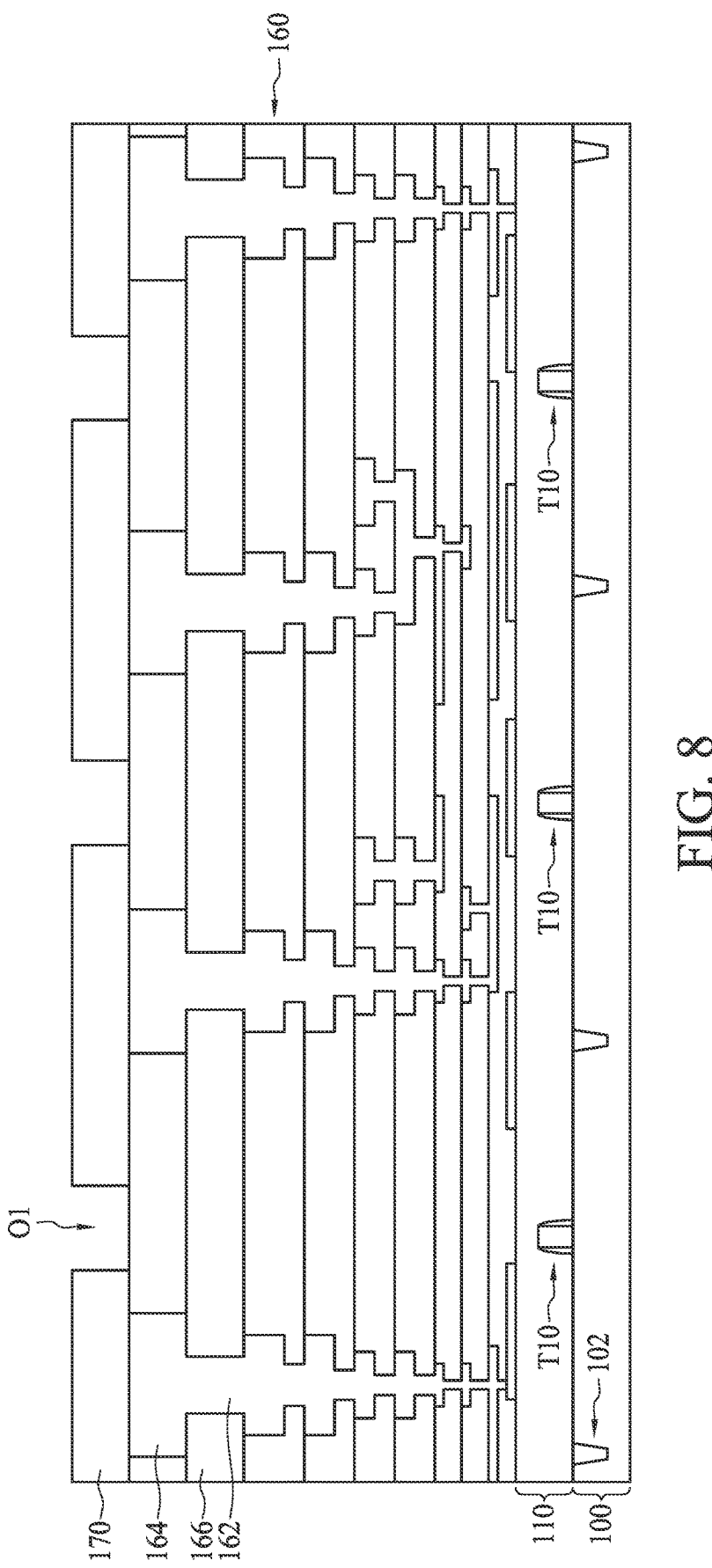
Figure 9:
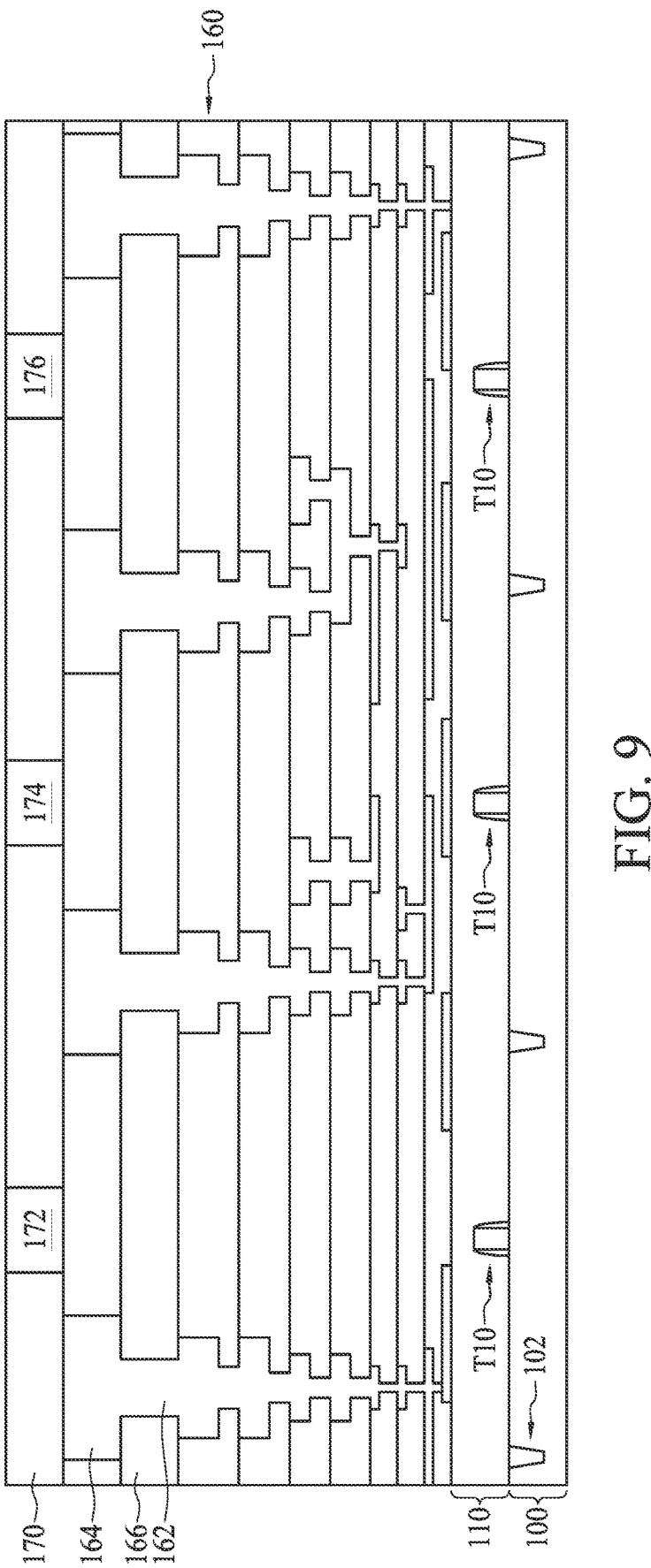

In operation 307 of FIG. 3, multiple gate structures 172, 174 and 176 are formed over the first interconnect structure 160, as shown in FIGS. 7 to 9. Referring to FIG. 7, an ILD layer 170 is deposited on the first interconnect structure 160. The ILD layer 170 may be made of the same or similar materials as those of the ILD layer 120 or the ILD layer 166. The ILD layer 170 may be formed spin-on coating, CVD, ALD, and/or other suitable methods.

Referring to FIG. 8, multiple openings O1 are formed in the ILD layer 170. The openings O1 may expose portions of the underlying first interconnect structure 160.

Referring to FIG. 9, a conductive material, such as W, Cu, Co, Al, Ni, Ta, Ti, Mo, Pd, Pt, Ru, Ir, Ag, Au, the like, or a combination thereof, may be deposited into the openings O1 using sputtering, electroplating, PVD or other suitable methods to form the first gate structure 172, the second gate structure 174 and the third gate structure 176. A planarization operation, such as a CMP operation, may be used to remove any excess conductive material over the top surface of the ILD layer 170. The first gate structure 172, the second gate structure 174 and the third gate structure 176 may be surrounded by the ILD layer 170.

Figure 10:
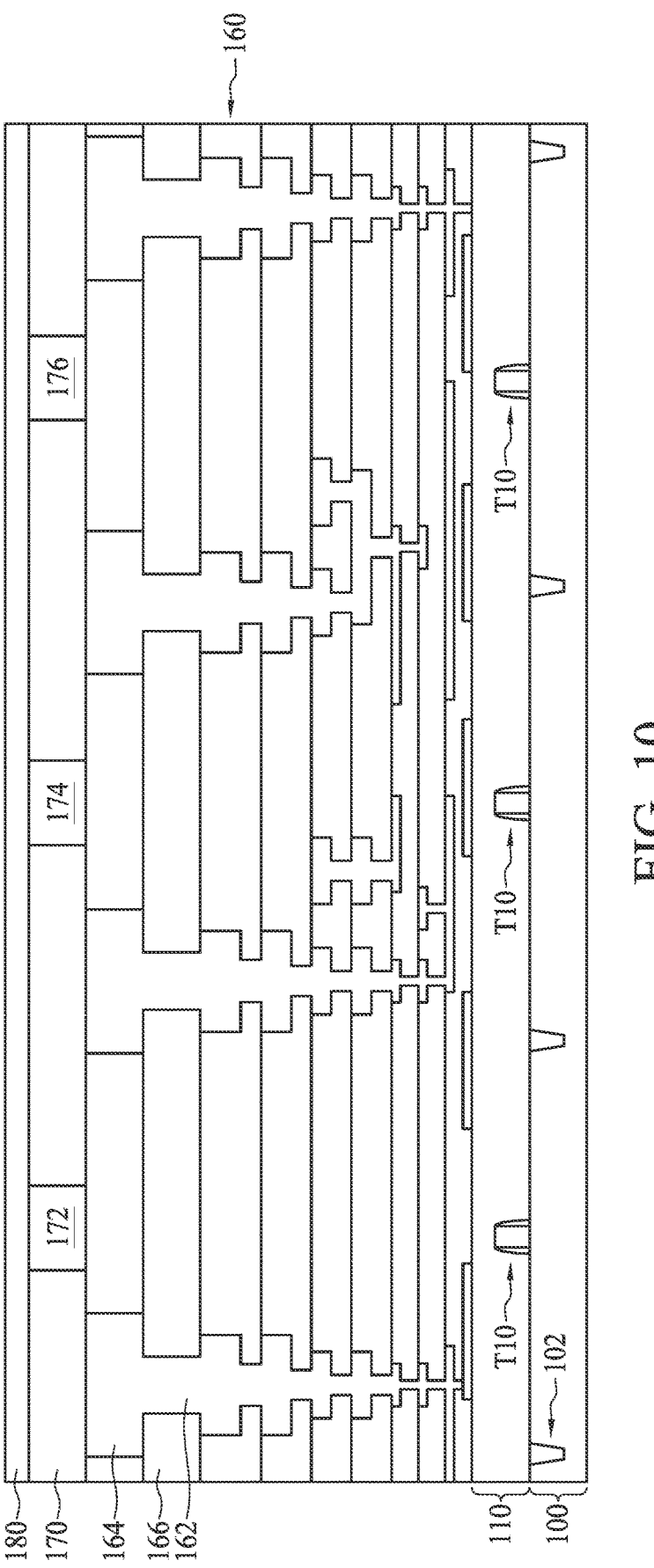

In operation 309 of FIG. 3, a gate dielectric layer 180 is deposited on the gate structures 172, 174 and 176, as shown in FIG. 10. The gate dielectric layer 180 may be formed using CVD, ALD, and/or other suitable methods. The gate dielectric layer 180 may be made of $HfO_2$, HfSiO, HfSiON, HfTaO, HfTiO or HfZrO. In some embodiments, the gate dielectric layer 180 is not patterned at this stage and remains covering the ILD layer 170. In some other embodiments, the gate dielectric layer 180 is patterned at this stage to form multiple gate dielectric features on the gate structures 172, 174 and 176, respectively.

Figure 11:
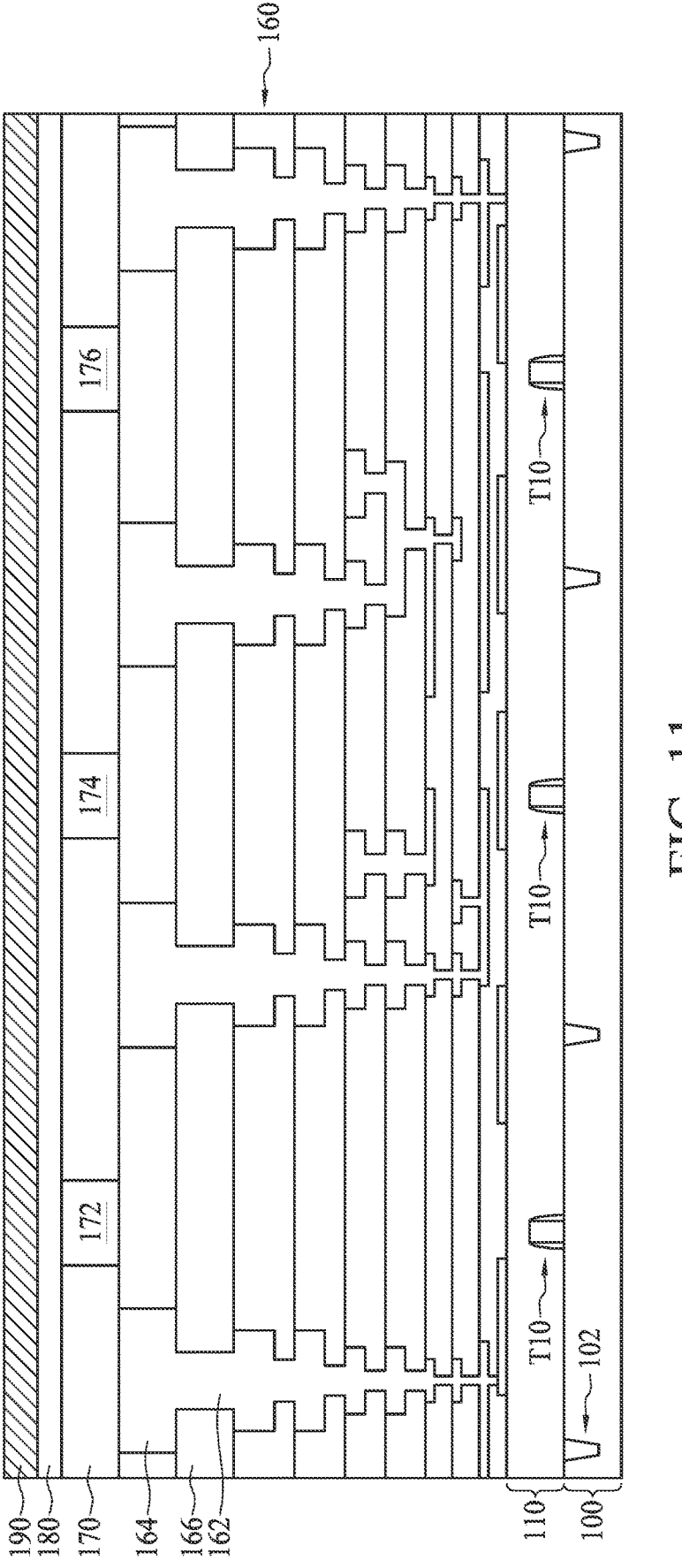
Figure 12:
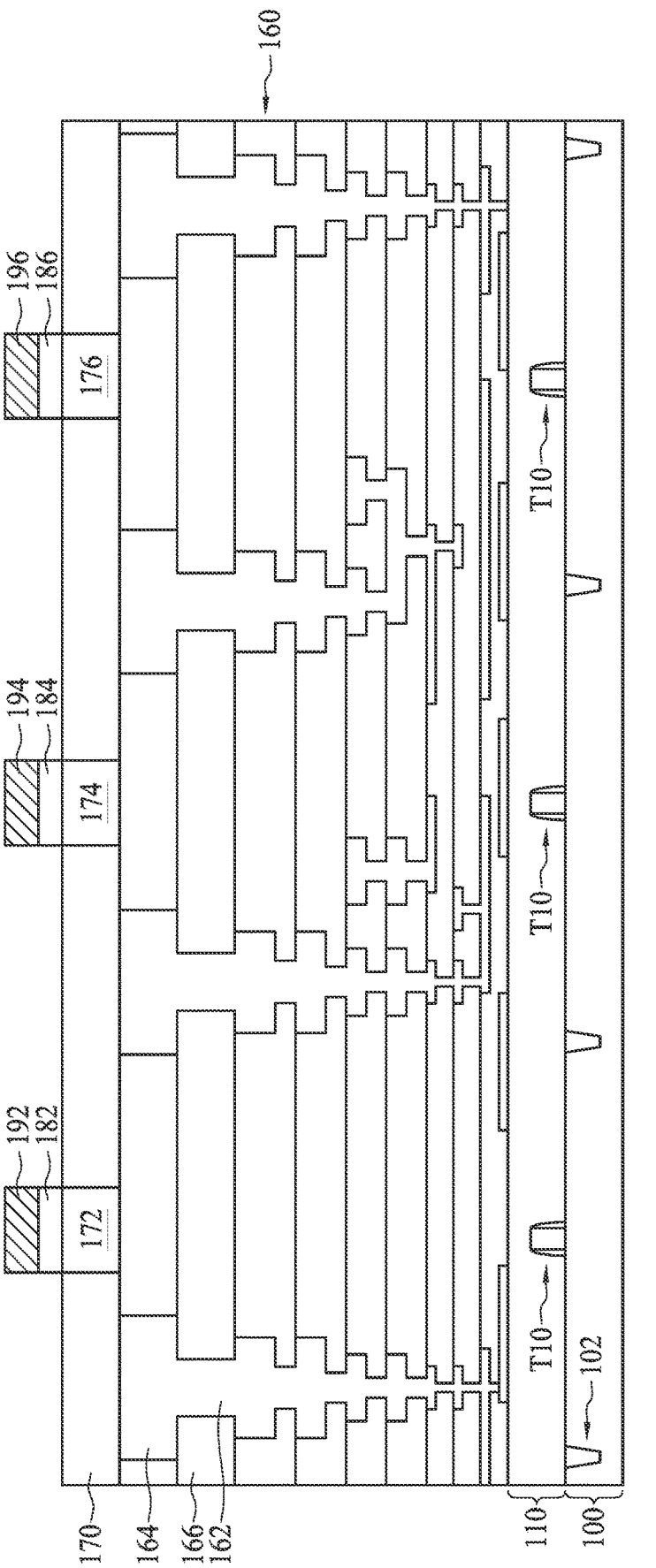

In operation 311 of FIG. 3, multiple metal oxide features 192, 194 and 196 are respectively formed over the gate structures 172, 174 and 176, as shown in FIGS. 11 and 12. Referring to FIG. 11, a metal oxide layer 190 is deposited on the gate dielectric layer 180. The metal oxide layer 190 may be formed using CVD, ALD, and/or other suitable methods. In some embodiments, the metal oxide layer 190 includes oxide semiconductors such as indium gallium zinc oxide (IGZO), zinc oxide (ZnO) or other suitable materials.

Referring to FIG. 12, the metal oxide layer 190 is patterned to form the metal oxide features 192, 194 and 196. In some embodiments, the gate dielectric layer 180 is patterned at the same time as the metal oxide layer 190 to form a first gate dielectric feature 182, a second gate dielectric feature 184 and a third gate dielectric feature 186. In some other embodiments, the metal oxide layer 190 and the gate dielectric layer 180 are patterned sequentially. The first gate dielectric feature 182 is formed on the first gate structure 172, the second gate dielectric feature 184 is formed on the second gate structure 174, and the third gate dielectric feature 186 is formed on the third gate structure 176. The first metal oxide feature 192 is formed on the first gate dielectric feature 182, the second metal oxide feature 194 is formed on the second gate dielectric feature 184 and the third metal oxide feature 196 is formed on the third gate dielectric feature 186.

Figure 13:
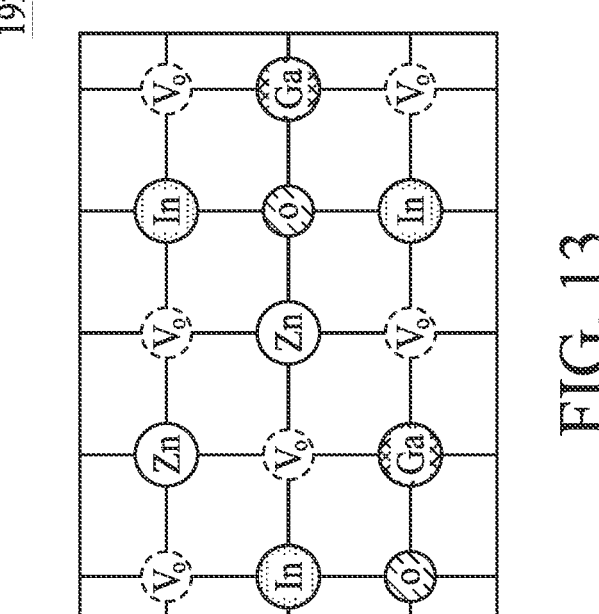

FIG. 13 shows a schematic lattice structure of the metal oxide feature 192, 194 or 196. Taking the first metal oxide feature 192 which includes IGZO for example, there are indium (In) atoms, gallium (Ga) atoms, zinc (Zn) atoms and oxygen (O) atoms in the lattice structure of the first metal oxide feature 192. In addition, there are some vacancies which are originally occupied by O atoms. These vacancies may be referred to as oxygen vacancies. In some embodiments, lattice structures of the metal oxide features 192, 194 and 196 have substantially the same amount of oxygen vacancies at this stage.

Figure 14:
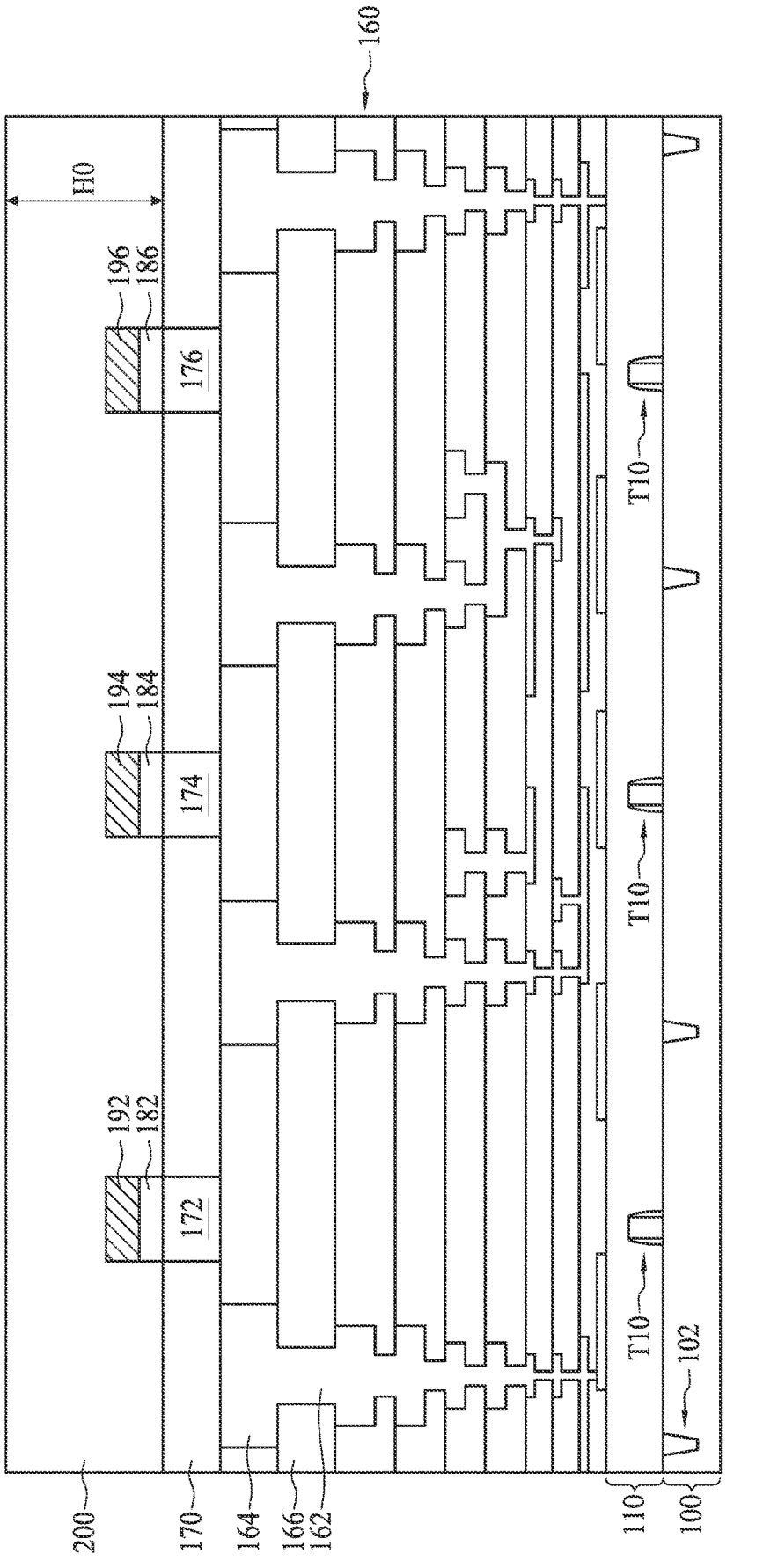

In operation 313 of FIG. 3, a patterned hard mask layer 200A, 200B or 200C is formed over the metal oxide features 192, 194 and 196, as shown in FIGS. 14 and 15A to 15C. Referring to FIG. 14, a hard mask layer 200 is formed on the metal oxide features 192, 194 and 196. The hard mask layer 200 may be formed using CVD, ALD, and/or other suitable methods. In some embodiments, the hard mask layer 200 is made of silicon oxide. In some embodiments, the hard mask layer 200 has a thickness H0 between about 1 angstrom (Å) and about 200 Å.

Figure 15A:
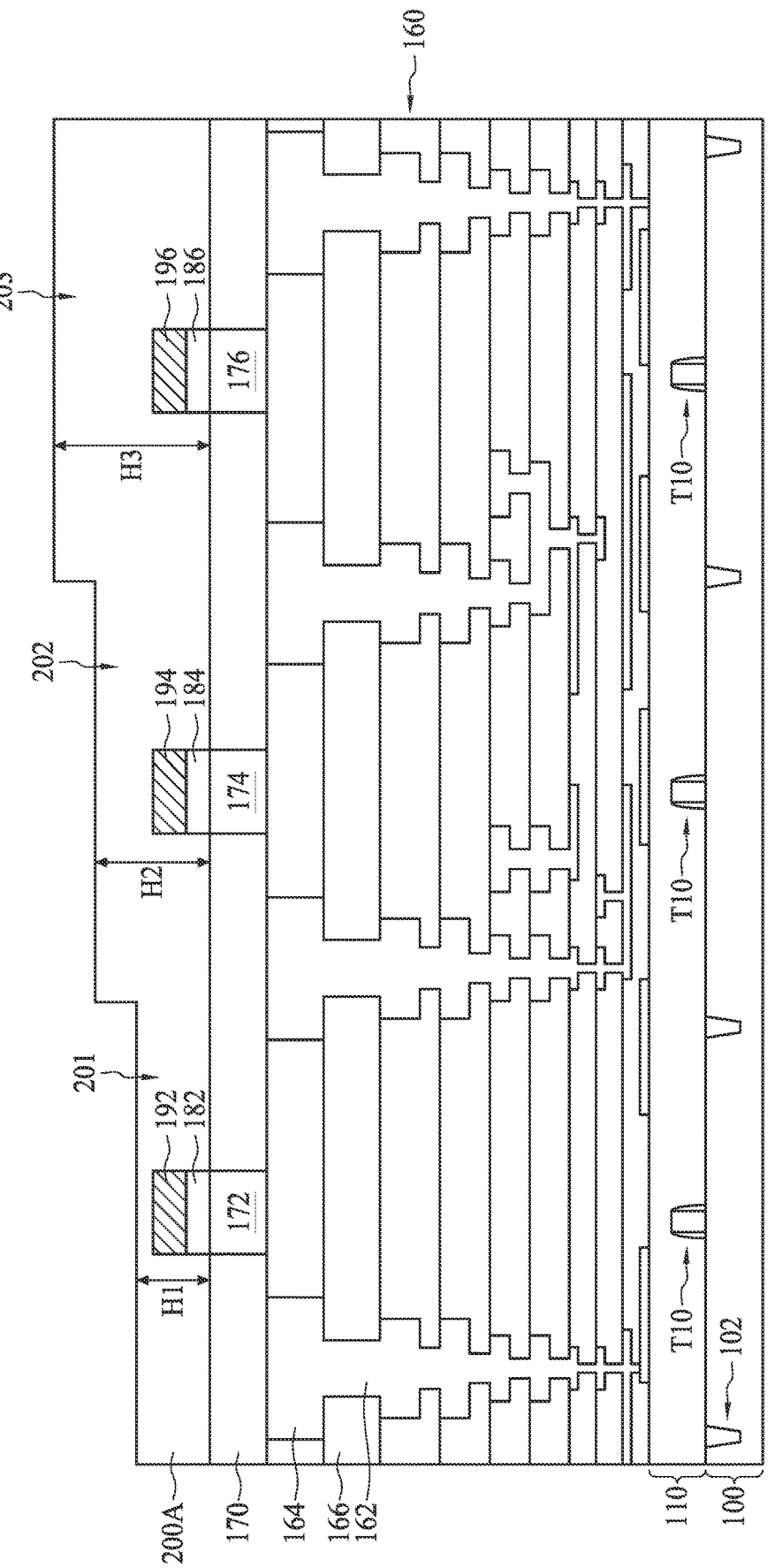
Figure 15B:
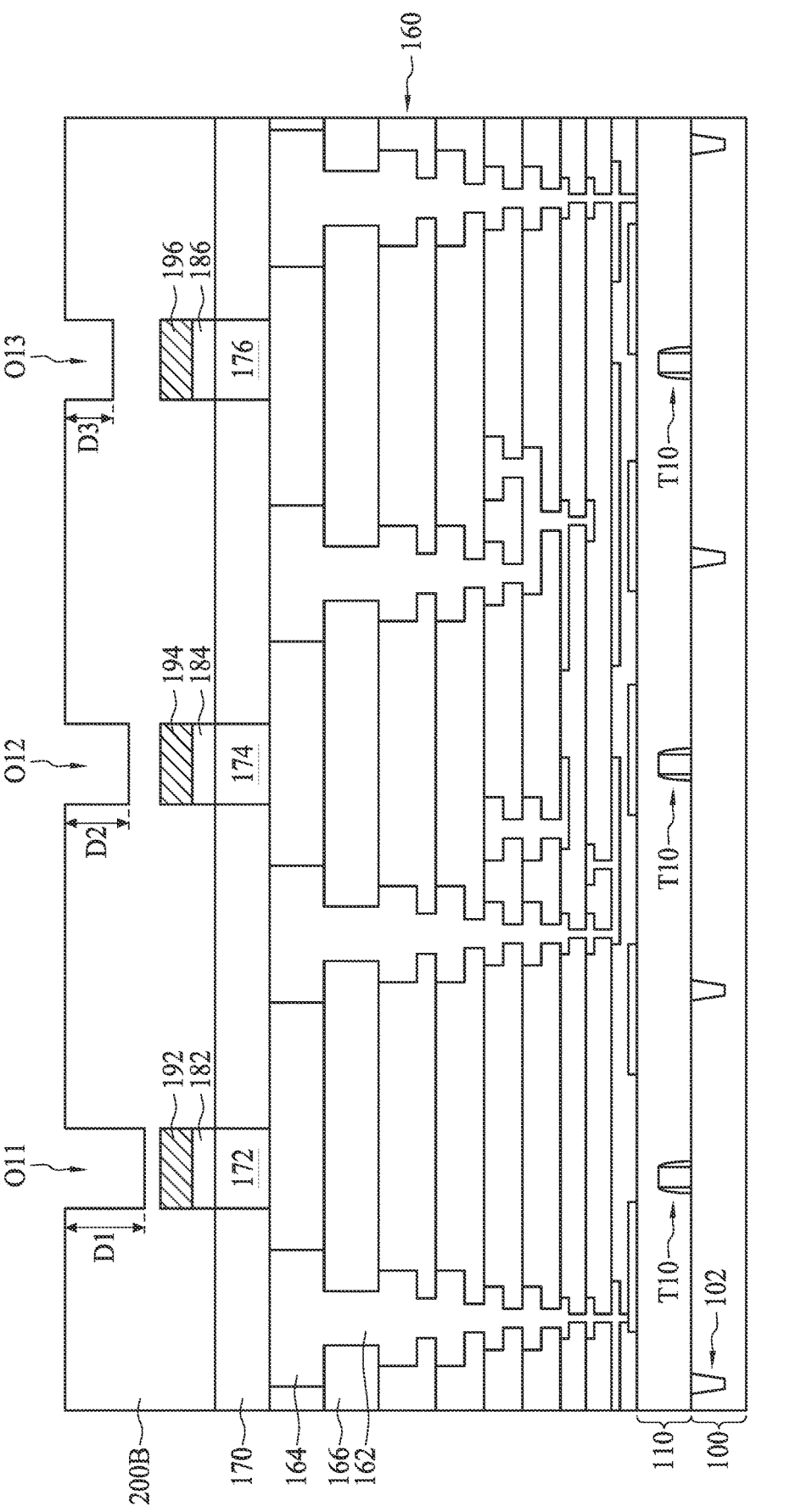
Figure 15C:
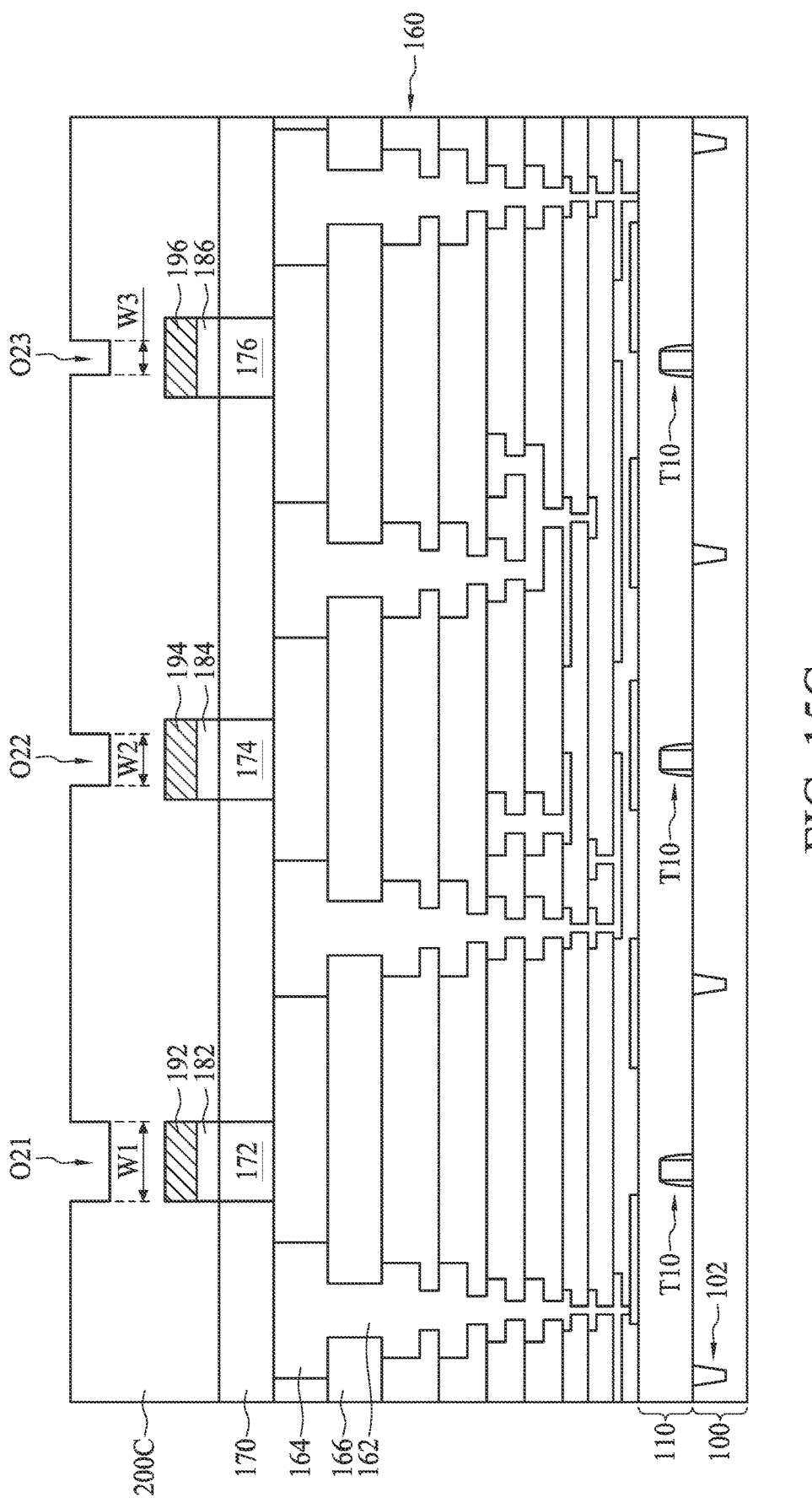

In FIGS. 15A to 15C, the hard mask layer 200 is patterned to have different profiles. Referring to FIG. 15A, the hard mask layer 200 is patterned to form the patterned hard mask layer 200A according to a first layout of a photomask. In some embodiments, the patterned hard mask layer 200A has different thicknesses corresponding to the first metal oxide feature 192, the second metal oxide feature 194 and the third metal oxide feature 196. The patterned hard mask layer 200A may have a ladder profile. For example, the patterned hard mask layer 200A includes a first portion 201 having a first thickness H1, a second portion 202 having a second thickness H2 and a third portion 203 having a third thickness H3. In some embodiments, the third thickness H3 is less than or equal to the thickness H0. In some embodiments, the third thickness H3 is greater than the second thickness H2, and the second thickness H2 is greater than the first thickness H1. The first thickness H1 may be 0, that is, the top surface of the first metal oxide feature 192 at such time is exposed.

Referring to FIG. 15B, the hard mask layer 200 is patterned to form the patterned hard mask layer 200B according to a second layout of a photomask. In some embodiments, the patterned hard mask layer 200B has multiple openings with different depths corresponding to the first metal oxide feature 192, the second metal oxide feature 194 and the third metal oxide feature 196. For example, the patterned hard mask layer 200B includes an opening O11 having a first depth D1, an opening O12 having a second depth D2 and an opening O13 having a third depth D3. In some embodiments, the first depth D1 is greater than the second depth D2, and the second depth D2 is greater than the third depth D3. In some embodiments, the openings O11, O12 and O13 have a substantially equal width.

Referring to FIG. 15C, the hard mask layer 200 is patterned to form the patterned hard mask layer 200C according to a third layout of a photomask. In some embodiments, the patterned hard mask layer 200C has multiple openings with different widths corresponding to the first metal oxide feature 192, the second metal oxide feature 194 and the third metal oxide feature 196. For example, the patterned hard mask layer 200B includes an opening O21 having a first width W1, an opening O22 having a second width W2 and an opening O23 having a third width W3. In some embodiments, the first width W1 is greater than the second width W2, and the second width W2 is greater than the third width W3. In some embodiments, the openings O21, O22 and O23 have a substantially equal depth.

Figure 16A:
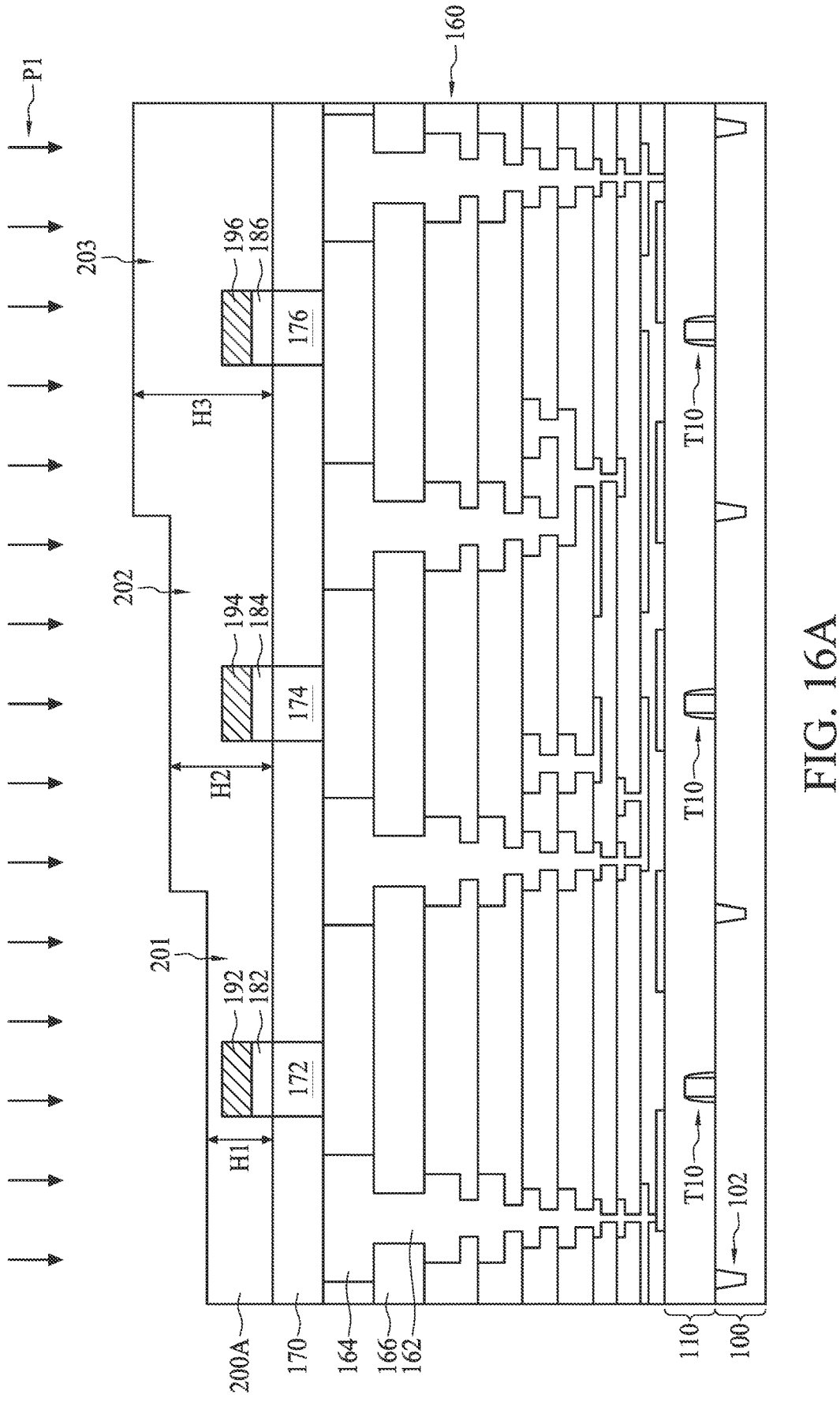
Figure 16B:
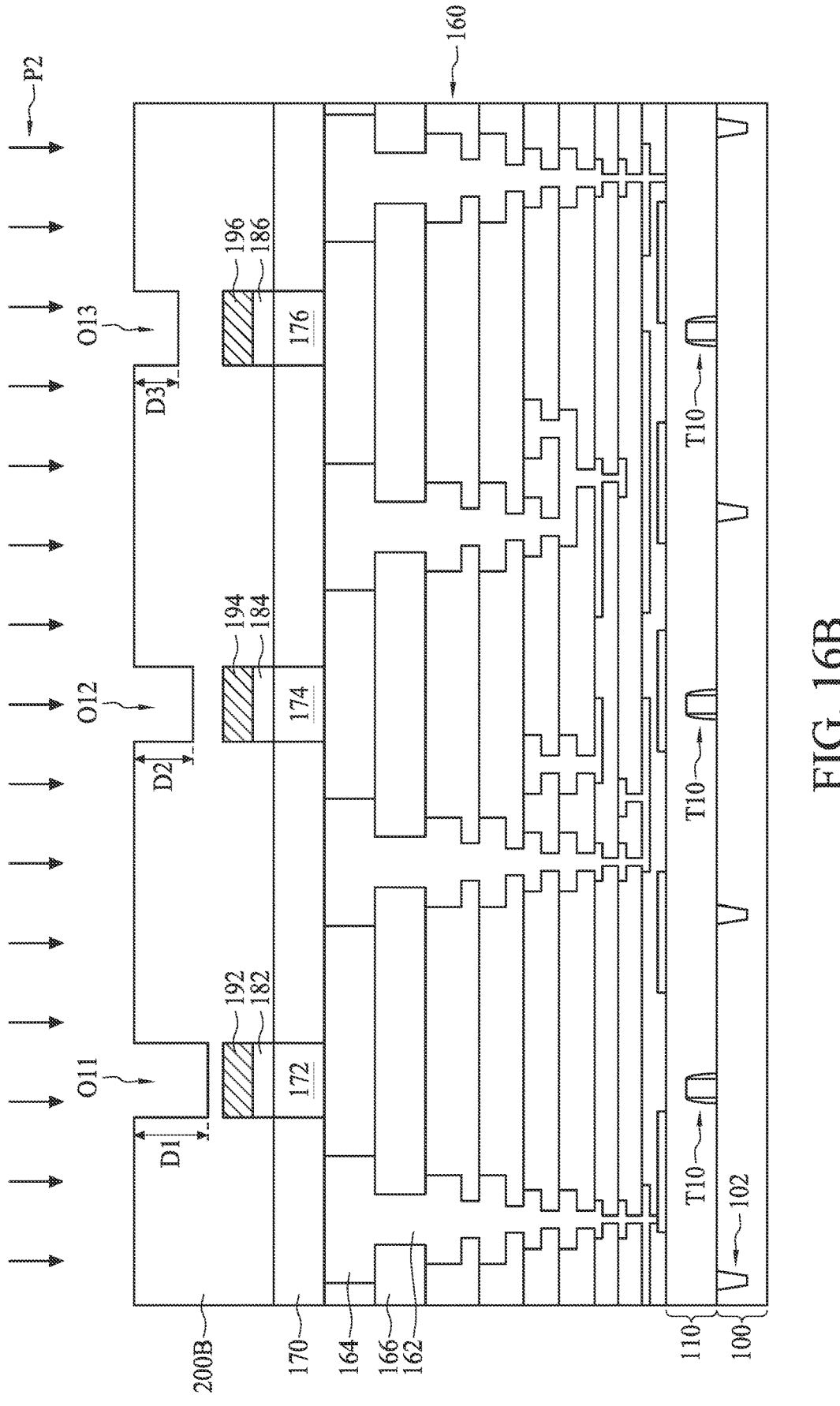
Figure 16C:
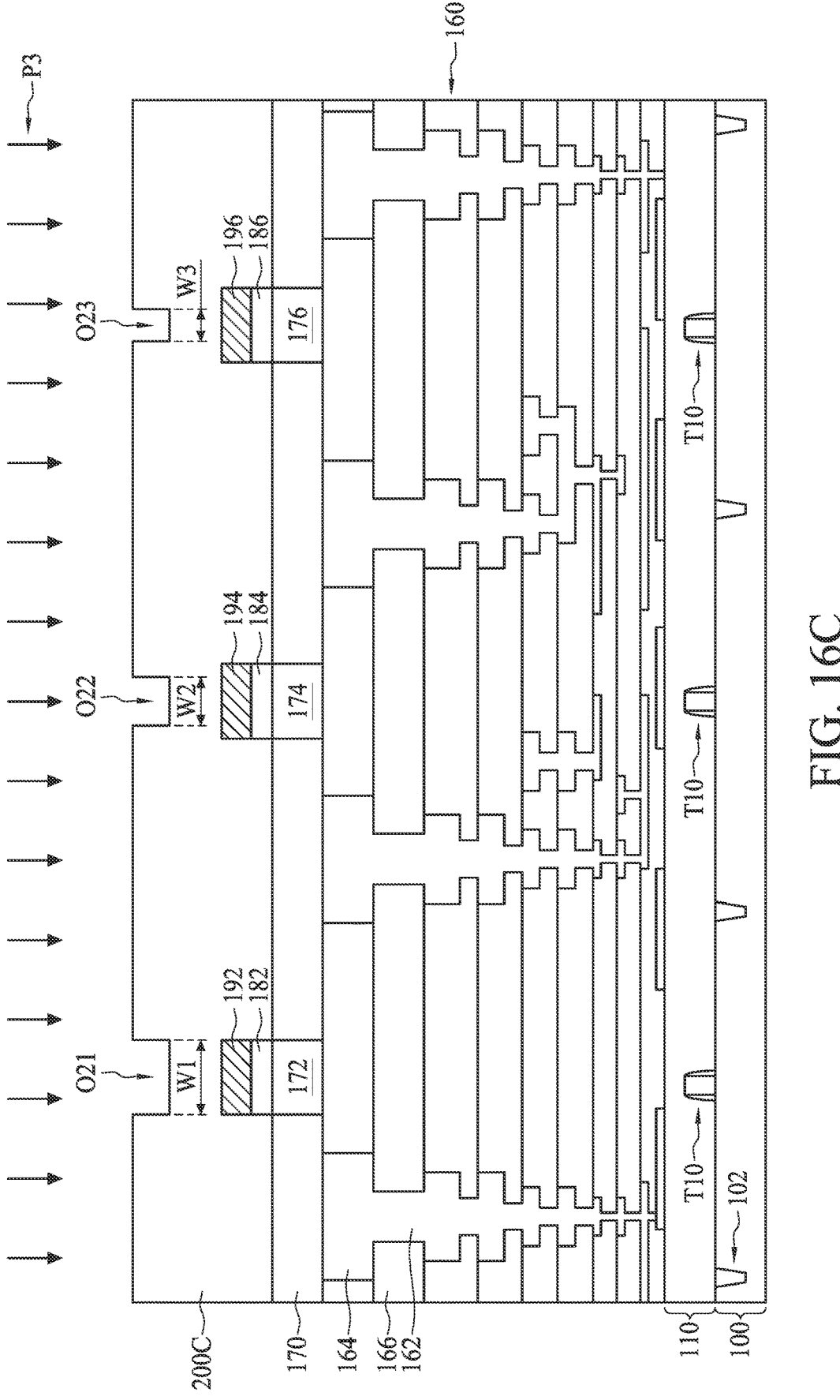

In operation 315 of FIG. 3, in some embodiments, an implantation operation P1 is performed on the metal oxide features 192, 194 and 196 using the patterned hard mask layer 200A as an implant mask, as shown in FIG. 16A. In some embodiments, an implantation operation P2 is performed on the metal oxide features 192, 194 and 196 using the patterned hard mask layer 200B as an implant mask, as shown in FIG. 16B. In some embodiments, an implantation operation P3 is performed on the metal oxide features 192, 194 and 196 using the patterned hard mask layer 200C as an implant mask, as shown in FIG. 16C. The energies or doses of the implantation operations P1, P2 and P3 may be the same or different. In some embodiments, the implantation operation P1, P2 or P3 uses $O_2$ or $N_2O$ to dope O atoms into the oxygen vacancies of the metal oxide features 192, 194 and 196. In some other embodiments, the implantation operation P1, P2 or P3 uses $F_2$ to dope F atoms into the oxygen vacancies of the metal oxide features 192, 194 and 196. Referring to FIG. 16A, during the implantation operation P1, some O atoms may be blocked by the patterned hard mask layer 200A, while some O atoms may pass through the patterned hard mask layer 200A to reach the metal oxide features 192, 194 and 196. Since the third thickness H3 is greater than the second thickness H2, and the second thickness H2 is greater than the first thickness H1, it is harder for O atoms to dope into the third metal oxide feature 196 than the second metal oxide feature 194 than the first metal oxide feature 192. As a result, after the implantation operation P1, the lattice structure of the third metal oxide feature 196 has less O atoms than the lattice structure of the second metal oxide feature 194, and the lattice structure of the second metal oxide feature 194 has less O atoms than the lattice structure of the first metal oxide feature 192.

Referring to FIG. 16B, during the implantation operation P2, O atoms enter the metal oxide features 192, 194 and 916 through the openings O11, O12 and O13, respectively. Since the first depth D1 is greater than the second depth D2, and the second depth D2 is greater than the third depth D3, it is easier for O atoms to dope into the first metal oxide feature 192 than the second metal oxide feature 194 than the third metal oxide feature 196. As a result, after the implantation operation P2, the lattice structure of the first metal oxide feature 192 has more O atoms than the lattice structure of the second metal oxide feature 194, and the lattice structure of the second metal oxide feature 194 has more O atoms than the lattice structure of the third metal oxide feature 196.

Referring to FIG. 16C, during the implantation operation P3, O atoms enter the metal oxide features 192, 194 and 916 through the openings O21, O22 and O23, respectively. Since the first width W1 is greater than the second width W2, and the second width W2 is greater than the third width W3, it is easier for O atoms to dope into the first metal oxide feature 192 than the second metal oxide feature 194 than the third metal oxide feature 196. As a result, after the implantation operation P3, the lattice structure of the first metal oxide feature 192 has more O atoms than the lattice structure of the second metal oxide feature 194, and the lattice structure of the second metal oxide feature 194 has more O atoms than the lattice structure of the third metal oxide feature 196.

Figure 17:
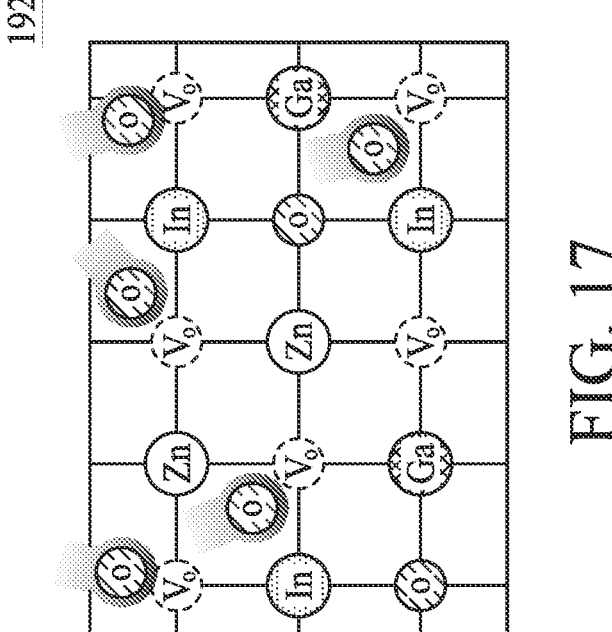

FIG. 17 shows a schematic lattice structure of the metal oxide feature 192, 194 or 196 after the implantation operation P1, P2 or P3. The doped O atoms may diffuse in the lattice structures of the metal oxide feature 192, 194 and 196 and some of the doped O atoms may fill into the oxygen vacancies.

Figure 18:
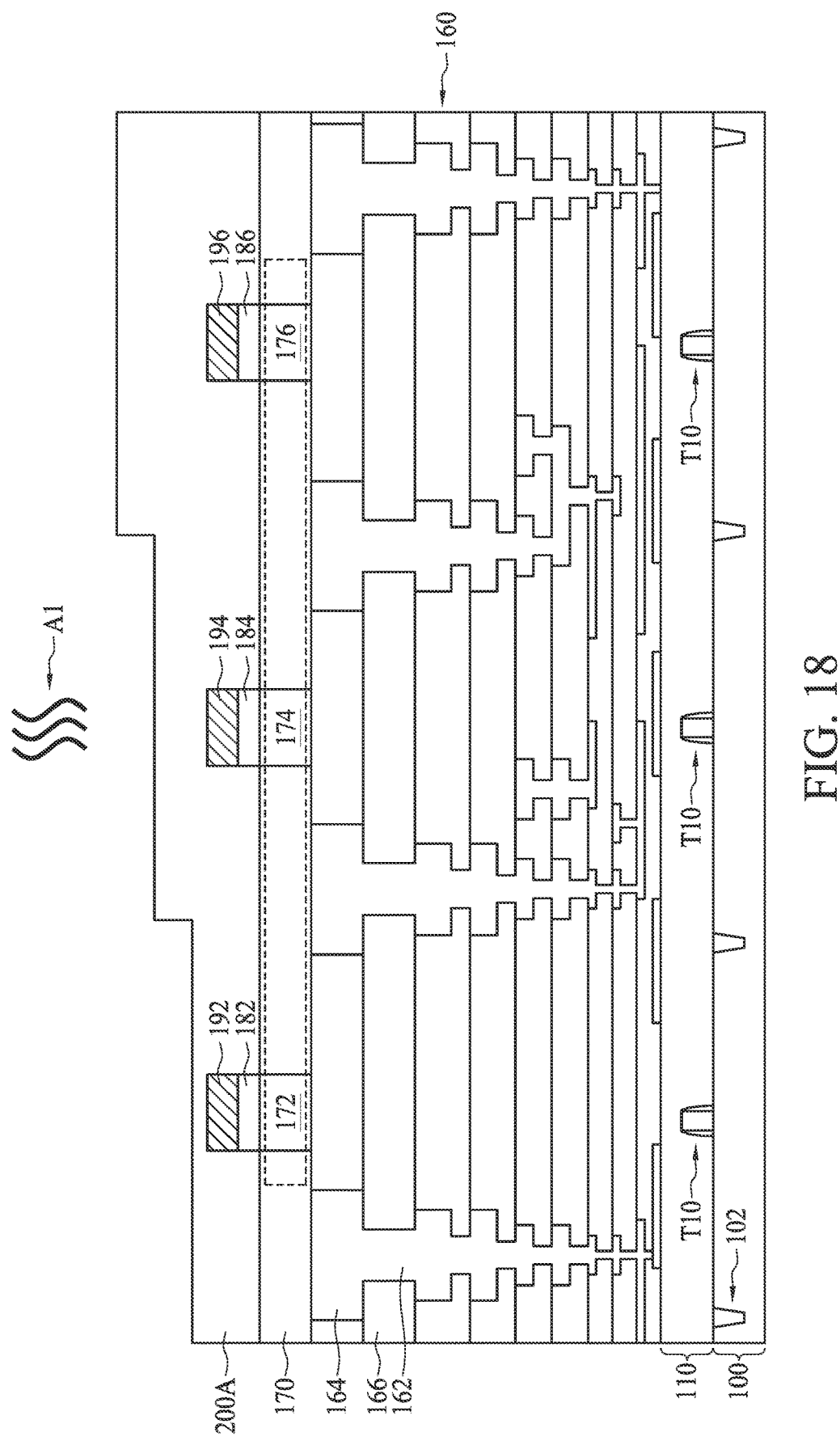
Figure 19:
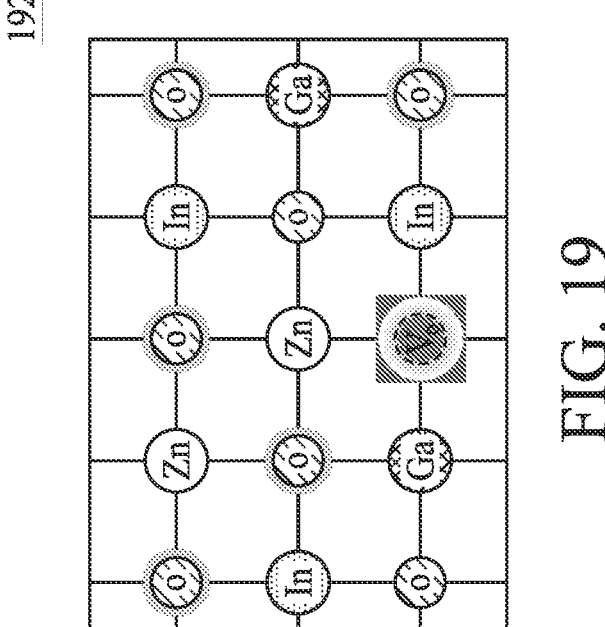

In operation 317 of FIG. 3, an annealing operation A1 is performed on the metal oxide features 192, 194 and 196, as shown in FIG. 18. The annealing operation A1 may use a rapid thermal annealing (RTA) tool to repair the lattice structures of the metal oxide features 192, 194 and 196 by forcing more doped O atoms to fill into the oxygen vacancies.

FIG. 18 shows a schematic lattice structure of the metal oxide feature 192, 194 or 196 after the annealing operation A1. The lattice structure of the third metal oxide feature 196 has more oxygen vacancies than the lattice structure of the second metal oxide feature 194, and the lattice structure of the second metal oxide feature 194 has more oxygen vacancies than the lattice structure of the first metal oxide feature 192. More oxygen vacancies mean there are more electron holes (carriers) in the lattice structure of the first metal oxide feature 192. Therefore, the third metal oxide feature 196 is more conductive than the second metal oxide feature 194 than the first metal oxide feature 192. In some embodiments, the implantation operation P1, P2 or P3 is to tune conductivity levels of the first metal oxide feature 192, the second metal oxide feature 194 and the third metal oxide feature 196 by introducing oxygen atoms into the first metal oxide feature 192, the second metal oxide feature 194 and the third metal oxide feature 196 through the first opening O21, the second opening O22 and the third opening O23, respectively. In some embodiments, after the implantation operation P1, P2 or P3, an electrical conductivity of the third metal oxide feature 196 is greater than an electrical conductivity of the second metal oxide layer 194, and the electrical conductivity of the second metal oxide layer 194 is greater than an electrical conductivity of the first metal oxide layer 192.

Figure 20:
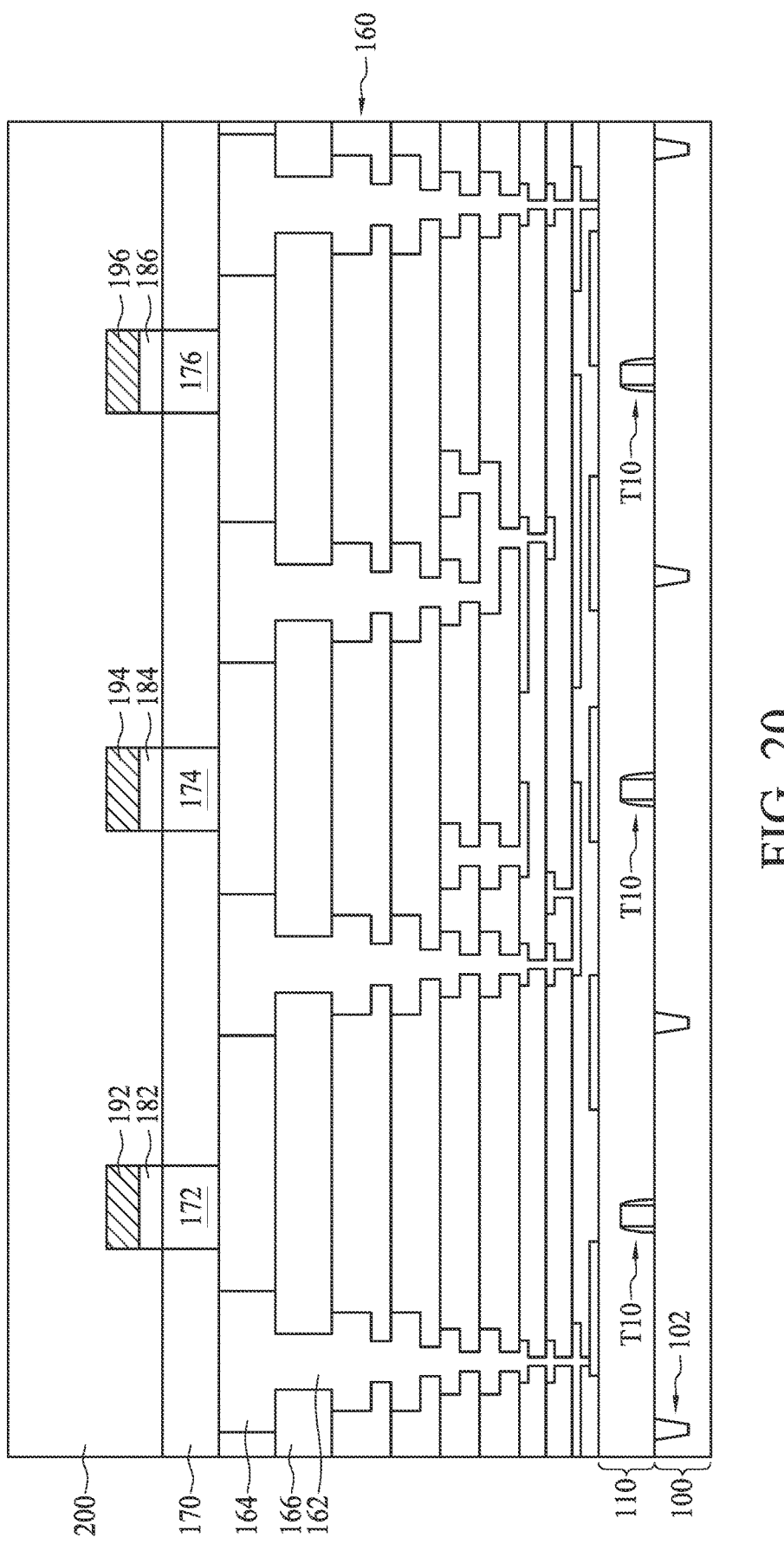

In operation 319 of FIG. 3, an additional material of the hard mask layer 200 is formed on the patterned hard mask layer 200A, 200B or 200C, as shown in FIG. 20. After the metal oxide features 192, 194 and 196 are doped with O atoms, the patterned hard mask layer 200A, 200B or 200C need to have a flat surface for subsequent operations. Therefore, the ladder profile of the patterned hard mask layer 200A, the openings O11, O12 and O13 of the patterned hard mask layer 200B, and the openings O21, O22 and O23 of the patterned hard mask layer 200C are filled using the same material of the hard mask layer 200. The combined hard mask layers are also referred to as the hard mask layer 200 for simplicity.

Figure 21:
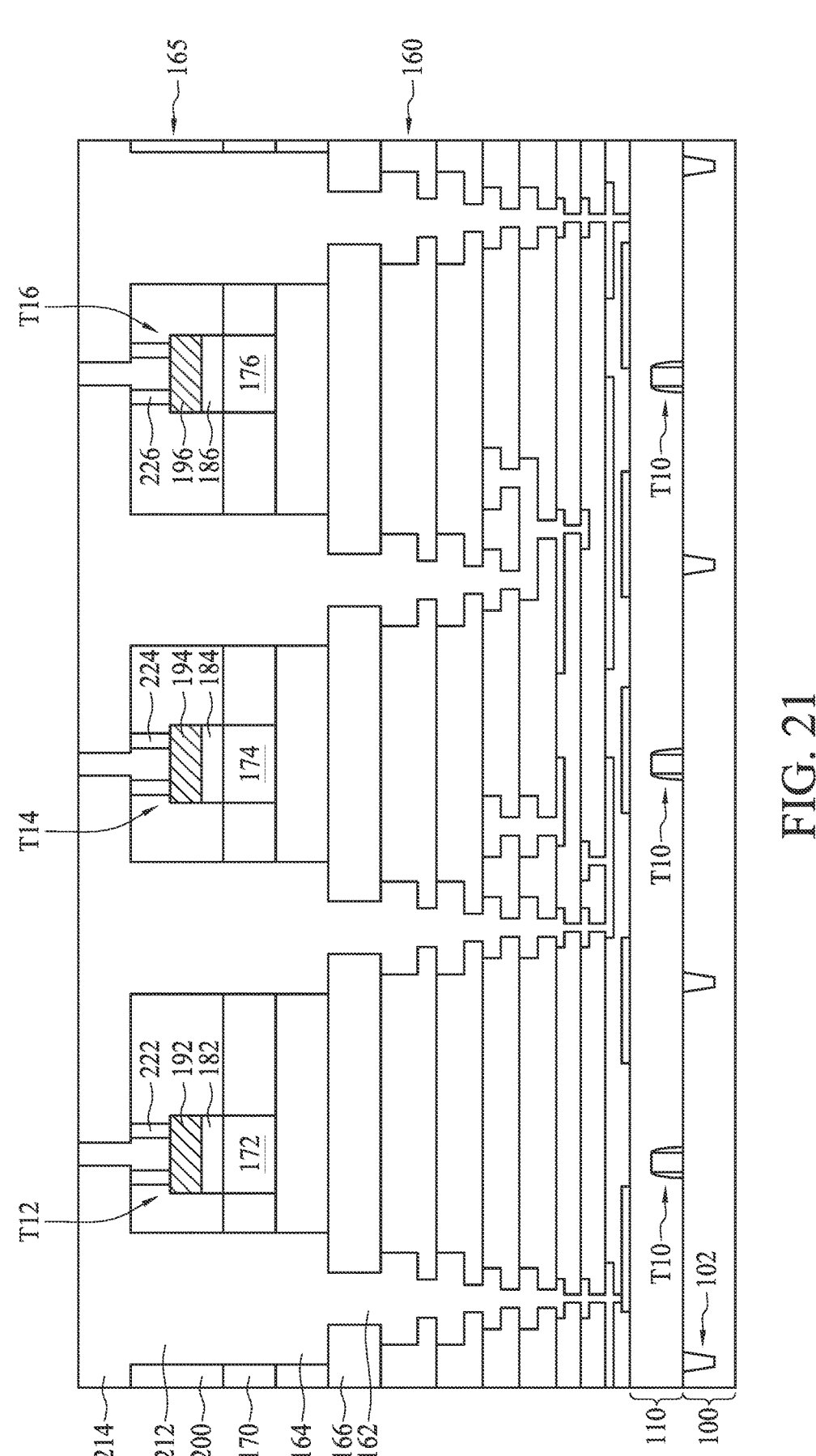

In operation 321 of FIG. 3, a second interconnect structure 165 is formed over the first interconnect structure 160, as shown in FIG. 21. The second interconnect structure 165 includes multiple higher-level conductive features such as conductive vias 212 and conductive lines 214 that are mutually connected and embedded in the hard mask layer 200. The hard mask layer 200 can also be referred to as an ILD layer 200. The formation method of the conductive vias 212 and the conductive lines 214 is similar to that of the conductive vias 162 and the conductive lines 164 and will not be repeated. A first S/D structure 222, a second S/D structure 224 and a third S/D structure 226 are formed on the first metal oxide feature 192, the second metal oxide feature 194 and the third metal oxide feature 196, respectively. The S/D structures 222, 224 and 226 may be electrically coupled to the second interconnect structure 165. At this stage, the fabrication of the semiconductor device 10 is complete. The second interconnect structure 165 and the first interconnect structure 160 may be collectively referred to as an interconnect structure.

Still referring to FIG. 21, the first gate structure 172, the first gate dielectric feature 182, the first metal oxide feature 192 and the first S/D structure 222 may form a first transistor T12. The second gate structure 174, the second gate dielectric feature 184, the second metal oxide feature 194 and the second S/D structure 224 may form a second transistor T14. The third gate structure 176, the third gate dielectric feature 186, the third metal oxide feature 196 and the third S/D structure 226 may form a third transistor T16. The transistors T12, T14 and T16 may be TFTs disposed adjacent to each other. The first transistor T12 may have a first threshold voltage, the second transistor T14 may have a second threshold voltage, and the third transistor T16 may have a third threshold voltage. In some embodiments, the first threshold voltage is greater than the second threshold voltage. In some embodiments, the second threshold voltage is greater than the third threshold voltage.

BEOL metal oxide TFTs are candidates for next generation memory due to their fast write/read speed and small size. The present disclosure provides multiple TFTs having different threshold voltages in the same layer of an interconnect structure. The metal oxide TFTs having different threshold voltages can be designed formed for different device requirements. In the present disclosure, the metal oxide TFTs having different threshold voltages are formed using a hard mask layer having different thicknesses. The threshold voltage of each metal oxide TFT is tunable according to a tunable thickness of a portion of the hard mask layer.

The BEOL metal oxide TFTs can be integrated with the FEOL CMOS transistors, which increases the flexibility for the FEOL logic circuit design.

One aspect of the present disclosure provides a method of forming a semiconductor device. The method includes: forming an interconnect structure over a substrate; forming a first gate structure and a second gate structure in a first layer of the interconnect structure; forming a first metal oxide layer and a second metal oxide layer in a second layer of the interconnect structure over the first gate structure and the second gate structure, respectively; forming an implant mask over the first metal oxide layer and the second metal oxide layer, the implant mask having different thicknesses corresponding to the first metal oxide layer and the second metal oxide layer; and performing an implantation operation on the first metal oxide layer and the second metal oxide layer.

One aspect of the present disclosure provides another method of forming a semiconductor device. The method includes: forming a transistor on a substrate; forming a first gate structure and a second gate structure over the transistor; forming a first gate dielectric feature and a second gate dielectric feature over the first gate structure and the second gate structure, respectively; forming a first metal oxide layer and a second metal oxide layer over the first gate dielectric feature the second gate dielectric feature, respectively; forming a hard mask over the first metal oxide layer and the second metal oxide layer; patterning the hard mask to include a first opening having a first depth and a second opening having a second depth over the first metal oxide layer and the second metal oxide layer, respectively, wherein the first depth is greater than the second depth; and performing an implantation operation on the first metal oxide layer and the second metal oxide layer through the first opening and the second opening, respectively.

One aspect of the present disclosure provides another method of manufacturing a semiconductor device including a TFT. The method includes: forming a transistor on a substrate; forming a first gate structure, a second gate structure and a third gate structure over the transistor; forming a gate dielectric layer over the first gate structure, the second gate structure and the third gate structure; respectively forming a first metal oxide layer, a second metal oxide layer and a third metal oxide layer over the first gate structure, the second gate structure and the third gate structure; forming an implant mask over the first metal oxide layer, the second metal oxide layer and the third metal oxide layer; patterning the implant mask to have a first opening having a first width, a second opening having a second width and a third opening having a third width over the first metal oxide layer, the second metal oxide layer and the third metal oxide layer, respectively, wherein the first width is greater than the second width, and the second width is greater than the third width; tuning conductivity levels of the first metal oxide layer, the second metal oxide layer and the third metal oxide layer by introducing oxygen atoms into the first metal oxide layer, the second metal oxide layer and the third metal oxide layer through the first opening, the second opening and the third opening, respectively; filling the first opening, the second opening and the third opening subsequent to the tuning of the conductivity levels; and forming a first source/drain (S/D) structure, a second S/D structure and a third S/D structure over the first metal oxide layer, the second metal oxide layer and the third metal oxide layer, respectively.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming an interconnect structure over a substrate;
forming a first gate structure and a second gate structure in a first layer of the interconnect structure;
forming a first metal oxide layer and a second metal oxide layer in a second layer of the interconnect structure over the first gate structure and the second gate structure, respectively;
forming an implant mask over the first metal oxide layer and the second metal oxide layer, the implant mask having different thicknesses corresponding to the first metal oxide layer and the second metal oxide layer;
performing an implantation operation on the first metal oxide layer and the second metal oxide layer; and
forming a first source/drain (S/D) structure and a second S/D structure over the first metal oxide layer and the second metal oxide layer, respectively,
the first gate structure, the first metal oxide layer and the first S/D structure form a first transistor having a first threshold voltage after the implantation operation,
the second gate structure, the second metal oxide layer and the second S/D structure form a second transistor adjacent to the first transistor and having a second threshold voltage after the implantation operation, and
the first threshold voltage is greater than the second threshold voltage in magnitude.

2. The method of claim 1, wherein the first metal oxide layer and the second metal oxide layer include oxide semiconductors.

3. The method of claim 1, further comprising forming a gate dielectric layer over the first and second gate structures prior to forming the first and second metal oxide layers.

4. The method of claim 1, further comprising annealing the first and second metal oxide layers to repair lattice structures of the first metal oxide layer and the second metal oxide layer.

5. The method of claim 1, wherein the implant mask is made of silicon oxide.

6. The method of claim 1, further comprising forming a third gate structure in the first layer of the interconnect structure.

7. The method of claim 1, wherein the implant mask laterally surrounds the first metal oxide layer and the second metal oxide layer.

8. A method, comprising:
forming a transistor on a substrate;
forming a first gate structure and a second gate structure over the transistor;
forming a first gate dielectric feature and a second gate dielectric feature over the first gate structure and the second gate structure, respectively;
forming a first metal oxide layer and a second metal oxide layer over the first gate dielectric feature and the second gate dielectric feature, respectively;
forming a hard mask over the first metal oxide layer and the second metal oxide layer;

patterning the hard mask to include a first portion having a first thickness and a second portion having a second thickness over the first metal oxide layer and the second metal oxide layer, respectively, wherein the first thickness is less than the second thickness;
performing an implantation operation on the first metal oxide layer and the second metal oxide layer through the first portion and the second portion, respectively; and
forming a first source/drain (S/D) structure and a second S/D structure over the first metal oxide layer and the second metal oxide layer, respectively,
wherein
the first gate structure, the first metal oxide layer and the first S/D structure form a first transistor having a first threshold voltage after the implantation operation,
the second gate structure, the second metal oxide layer and the second S/D structure form a second transistor adjacent to the first transistor and having a second threshold voltage after the implantation operation and
the first threshold voltage is greater than the second threshold voltage in magnitude.

9. The method of claim 8, wherein the hard mask laterally surrounds the first metal oxide layer and the second metal oxide layer.

10. The method of claim 8, further comprising, after the implantation operation, filling an additional material of the hard mask to form a substantially flat upper surface of the hard mask.

11. The method of claim 8, wherein after the implantation operation, the first metal oxide layer has less lattice vacancies than the second metal oxide layer.

12. The method of claim 8, wherein a dopant of the implantation operation comprises boron, gallium, indium, phosphorous and arsenide.

13. The method of claim 8, wherein the implantation operation includes using $O_2$ or $N_2O$.

14. A method of manufacturing a semiconductor device including a thin film transistor (TFT), comprising:
forming a transistor on a substrate;
forming a first gate structure, a second gate structure and a third gate structure over the transistor;
forming a gate dielectric layer over each of the first gate structure, the second gate structure and the third gate structure;
forming a first metal oxide layer, a second metal oxide layer and a third metal oxide layer over the first gate structure, the second gate structure and the third gate structure, respectively;
forming an implant mask over the first metal oxide layer, the second metal oxide layer and the third metal oxide layer;
patterning the implant mask to have a first portion having a first thickness, a second portion having a second thickness and a third portion having a third thickness over the first metal oxide layer, the second metal oxide layer and the third metal oxide layer, respectively, wherein the first thickness is less than the second thickness, and the second thickness is less than the third thickness;
tuning conductivity levels of the first metal oxide layer, the second metal oxide layer and the third metal oxide layer by introducing oxygen atoms into the first metal oxide layer, the second metal oxide layer and the third metal oxide layer through the first portion, the second portion and the third portion, respectively; and forming a first source/drain (S/D) structure, a second S/D structure and a third S/D structure over the first metal oxide layer, the second metal oxide layer and the third metal oxide layer, respectively, wherein the first gate structure, the first metal oxide layer and the first S/D structure form a first transistor having a first threshold voltage after the tuning of the conductivity levels, the second gate structure, the second metal oxide layer and the second S/D structure form a second transistor adjacent to the first transistor and having a second threshold voltage after the tuning of the conductivity levels, the third gate structure, the third metal oxide layer and the third S/D structure form a third transistor adjacent to the second transistor and having a third threshold voltage after the tuning of the conductivity levels, the first threshold voltage is greater than the second threshold voltage in magnitude, and the second threshold voltage is greater than the third threshold voltage in magnitude.

15. The method of claim 14, wherein the first metal oxide layer, the second metal oxide layer and the third metal oxide layer include indium gallium zinc oxide (IGZO) or zinc oxide (ZnO).

16. The method of claim 14, wherein the tuning of the conductivity levels of the first metal oxide layer, the second metal oxide layer and the third metal oxide layer are performed using a same ion implantation operation.

17. The method of claim 14, wherein the implant mask has a thickness between about 1 angstrom (Å) and about 200 Å.

18. The method of claim 14, wherein after the tuning of the conductivity levels, the first metal oxide layer has less lattice vacancies than the second metal oxide layer.

19. The method of claim 14, comprising, after the tuning of the conductivity levels, depositing a dielectric layer over the implant mask with a flat upper surface.

20. The method of claim 19, wherein the dielectric layer and the implant mask are made of a same material.

* * * * *